(12) United States Patent
Jenne et al.

(10) Patent No.: US 10,699,901 B2
(45) Date of Patent: Jun. 30, 2020

(54) SONOS ONO STACK SCALING

(71) Applicant: LONGITUDE FLASH MEMORY SOLUTIONS LTD., Dublin (IE)

(72) Inventors: Frederick B. Jenne, Mountain House, CA (US); Sagy Charel Levy, Zichron Yaakov (IL); Krishnaswamy Ramkumar, San Jose, CA (US)

(73) Assignee: LONGITUDE FLASH MEMORY SOLUTIONS LTD., Dublin (IE)

( * ) Notice: Subject to any disclaimer, the term of this patent is extended or adjusted under 35 U.S.C. 154(b) by 0 days.

(21) Appl. No.: 15/988,981

(22) Filed: May 24, 2018

(65) Prior Publication Data
US 2018/0351003 A1 Dec. 6, 2018

Related U.S. Application Data

(63) Continuation of application No. 15/051,279, filed on Feb. 23, 2016, now Pat. No. 9,997,641, which is a
(Continued)

(51) Int. Cl.
*H01L 21/336* (2006.01)
*H01L 21/02* (2006.01)
(Continued)

(52) U.S. Cl.
CPC ...... *H01L 21/02332* (2013.01); *H01L 21/022* (2013.01); *H01L 21/02238* (2013.01);
(Continued)

(58) Field of Classification Search
CPC ......... H01L 21/02532; H01L 21/02595; H01L 21/02667; H01L 21/3105; H01L 21/3143;
(Continued)

(56) References Cited

U.S. PATENT DOCUMENTS

| 4,395,438 A | 7/1983 | Chiang |
| 4,543,707 A | 10/1985 | Ito et al. |
| (Continued) | | |

FOREIGN PATENT DOCUMENTS

| CN | 101517714 A | 8/2009 |
| CN | 104254921 A | 12/2014 |
| (Continued) | | |

OTHER PUBLICATIONS

USPTO Advisory Action for U.S. Appl. No. 15/252,059 dated Jan. 22, 2019, 3 pages.
(Continued)

*Primary Examiner* — Meiya Li
(74) *Attorney, Agent, or Firm* — Kunzler Bean & Adamson

(57) ABSTRACT

A method of scaling a nonvolatile trapped-charge memory device and the device made thereby is provided. In an embodiment, the method includes forming a channel region including polysilicon electrically connecting a source region and a drain region in a substrate. A tunneling layer is formed on the substrate over the channel region by oxidizing the substrate to form an oxide film and nitridizing the oxide film. A multi-layer charge trapping layer including an oxygen-rich first layer and an oxygen-lean second layer is formed on the tunneling layer, and a blocking layer deposited on the multi-layer charge trapping layer. In one embodiment, the method further includes a dilute wet oxidation to densify a deposited blocking oxide and to oxidize a portion of the oxygen-lean second layer.

21 Claims, 19 Drawing Sheets

Related U.S. Application Data continuation of application No. 13/539,461, filed on Jul. 1, 2012, now Pat. No. 9,299,568, which is a continuation-in-part of application No. 11/904,506, filed on Sep. 26, 2007, now Pat. No. 8,614,124.

(60) Provisional application No. 60/940,384, filed on May 25, 2007.

(51) Int. Cl.

| | | |
|---|---|---|
| *H01L 21/28* | (2006.01) | |
| *H01L 21/314* | (2006.01) | |
| *H01L 29/51* | (2006.01) | |
| *H01L 29/66* | (2006.01) | |
| *H01L 29/792* | (2006.01) | |
| *H01L 21/3105* | (2006.01) | |
| *H01L 29/04* | (2006.01) | |
| *H01L 29/16* | (2006.01) | |
| *H01L 29/423* | (2006.01) | |
| *H01L 29/49* | (2006.01) | |

(52) U.S. Cl.
CPC .. *H01L 21/02532* (2013.01); *H01L 21/02595* (2013.01); *H01L 21/02667* (2013.01); *H01L 21/3105* (2013.01); *H01L 21/3143* (2013.01); *H01L 29/04* (2013.01); *H01L 29/16* (2013.01); *H01L 29/40117* (2019.08); *H01L 29/42364* (2013.01); *H01L 29/4916* (2013.01); *H01L 29/513* (2013.01); *H01L 29/515* (2013.01); *H01L 29/518* (2013.01); *H01L 29/66833* (2013.01); *H01L 29/792* (2013.01)

(58) Field of Classification Search
CPC ... H01L 29/04; H01L 29/16; H01L 29/42364; H01L 29/4916; H01L 29/513; H01L 29/515; H01L 29/518; H01L 29/66833; H01L 29/792; H01L 21/022; H01L 21/02238; H01L 21/02332; H01L 21/28282; H01L 29/40117
See application file for complete search history.

(56) References Cited

U.S. PATENT DOCUMENTS

| | | | |
|---|---|---|---|
| 4,667,217 | A | 5/1987 | Janning |
| 4,843,023 | A | 6/1989 | Chiu et al. |
| 5,404,791 | A | 4/1995 | Kervagoret |
| 5,405,791 | A | 4/1995 | Ahmad et al. |
| 5,573,963 | A | 11/1996 | Sung |
| 5,773,343 | A | 6/1998 | Lee et al. |
| 5,793,089 | A | 8/1998 | Fulford et al. |
| 5,817,170 | A | 10/1998 | Desu et al. |
| 5,847,411 | A | 12/1998 | Morii |
| 5,972,765 | A | 10/1999 | Clark et al. |
| 6,001,713 | A | 12/1999 | Ramsbey et al. |
| 6,015,739 | A | 1/2000 | Gardner et al. |
| 6,136,654 | A | 10/2000 | Kraft et al. |
| 6,153,543 | A | 11/2000 | Chesire et al. |
| 6,157,426 | A | 12/2000 | Gu |
| 6,214,689 | B1 | 4/2001 | Lim et al. |
| 6,218,700 | B1 | 4/2001 | Papadas |
| 6,297,096 | B1 | 10/2001 | Boaz |
| 6,321,134 | B1 | 11/2001 | Henley et al. |
| 6,365,518 | B1 | 4/2002 | Lee et al. |
| 6,429,081 | B1 | 8/2002 | Doong et al. |
| 6,433,383 | B1 | 8/2002 | Ramsbey et al. |
| 6,444,521 | B1 | 9/2002 | Chang et al. |
| 6,445,030 | B1 | 9/2002 | Wu et al. |
| 6,461,899 | B1 | 10/2002 | Kitakado et al. |
| 6,469,343 | B1 | 10/2002 | Miura et al. |
| 6,479,339 | B2 | 11/2002 | Nandakumar et al. |
| 6,518,113 | B1 | 2/2003 | Buynoski |
| 6,548,856 | B1 | 4/2003 | Lin et al. |
| 6,586,349 | B1 | 7/2003 | Jeon et al. |
| 6,596,590 | B1 | 7/2003 | Miura et al. |
| 6,610,614 | B2 | 8/2003 | Niimi et al. |
| 6,677,213 | B1 | 1/2004 | Ramkumar et al. |
| 6,709,928 | B1 | 3/2004 | Jenne et al. |
| 6,717,860 | B1 | 4/2004 | Fujiwara |
| 6,746,968 | B1 | 6/2004 | Tseng et al. |
| 6,768,856 | B2 | 7/2004 | Akwani et al. |
| 6,774,433 | B2 | 8/2004 | Lee et al. |
| 6,818,558 | B1 | 11/2004 | Rathor et al. |
| 6,833,582 | B2 | 12/2004 | Mine et al. |
| 6,835,621 | B2 | 12/2004 | Yoo et al. |
| 6,946,349 | B1 | 9/2005 | Lee et al. |
| 6,949,787 | B2 | 9/2005 | Snyder et al. |
| 6,958,511 | B1 | 10/2005 | Halliyal et al. |
| 7,018,868 | B1 | 3/2006 | Yang et al. |
| 7,033,957 | B1 | 4/2006 | Shiraiwa et al. |
| 7,060,594 | B2 | 6/2006 | Wang |
| 7,091,089 | B2 | 8/2006 | Steimle |
| 7,091,130 | B1 | 8/2006 | Rao et al. |
| 7,112,486 | B2 | 9/2006 | Cho et al. |
| 7,115,469 | B1 | 10/2006 | Halliyal et al. |
| 7,279,740 | B2 | 10/2007 | Bhattacharyya et al. |
| 7,315,474 | B2 | 1/2008 | Lue |
| 7,365,389 | B1 | 4/2008 | Jeon et al. |
| 7,390,718 | B2 | 6/2008 | Roizin et al. |
| 7,429,767 | B2 | 9/2008 | Bhattacharyya |
| 7,450,423 | B2 | 11/2008 | Lai et al. |
| 7,463,530 | B2 | 12/2008 | Lue et al. |
| 7,482,236 | B2 | 1/2009 | Lee et al. |
| 7,514,323 | B2 | 4/2009 | Dobuzinsky et al. |
| 7,576,386 | B2 | 8/2009 | Lue et al. |
| 7,642,585 | B2 | 1/2010 | Wang et al. |
| 7,646,041 | B2 | 1/2010 | Chae et al. |
| 7,651,915 | B2 | 1/2010 | Yan et al. |
| 7,670,963 | B2 | 3/2010 | Ramkumar et al. |
| 7,678,662 | B2 | 3/2010 | Arghavani et al. |
| 7,688,626 | B2 | 3/2010 | Lue et al. |
| 7,692,246 | B2 | 4/2010 | Dreeskornfeld et al. |
| 7,723,789 | B2 | 5/2010 | Lin et al. |
| 7,811,886 | B2 | 10/2010 | Winstead et al. |
| 7,811,887 | B2 | 10/2010 | Irani et al. |
| 7,816,728 | B2 | 10/2010 | Ho et al. |
| 7,927,951 | B2 | 4/2011 | Kim et al. |
| 7,948,799 | B2 | 5/2011 | Lue et al. |
| 7,972,929 | B2 | 7/2011 | Lee |
| 7,999,295 | B2 | 8/2011 | Lai et al. |
| 8,008,713 | B2 | 8/2011 | Dobuzinsky et al. |
| 8,063,434 | B1 | 11/2011 | Polishchuk et al. |
| 8,067,284 | B1 | 11/2011 | Levy |
| 8,071,453 | B1 | 12/2011 | Ramkumar et al. |
| 8,093,128 | B2 | 1/2012 | Koutny et al. |
| 8,120,095 | B2 | 2/2012 | Ho et al. |
| 8,143,129 | B2 | 3/2012 | Ramkumar et al. |
| 8,163,660 | B2 | 4/2012 | Puchner et al. |
| 8,222,688 | B1 | 7/2012 | Jenne et al. |
| 8,264,028 | B2 | 9/2012 | Lue et al. |
| 8,283,261 | B2 | 10/2012 | Ramkumar |
| 8,315,095 | B2 | 11/2012 | Lue et al. |
| 8,318,608 | B2 | 11/2012 | Ramkumar et al. |
| 8,482,052 | B2 | 7/2013 | Lue et al. |
| 8,614,124 | B2 | 12/2013 | Jenne et al. |
| 8,860,122 | B1 | 10/2014 | Polishchuk et al. |
| 9,299,568 | B2 | 3/2016 | Jenne et al. |
| 9,431,549 | B2 | 8/2016 | Polishchuk et al. |
| 2001/0052615 | A1 | 12/2001 | Fujiwara |
| 2002/0028541 | A1 | 3/2002 | Lee et al. |
| 2002/0141237 | A1 | 10/2002 | Goda et al. |
| 2002/0145159 | A1 | 10/2002 | Ishii et al. |
| 2002/0154878 | A1 | 10/2002 | Akwani et al. |
| 2003/0071302 | A1 | 4/2003 | Hirotomo et al. |
| 2003/0122204 | A1 | 7/2003 | Nomoto et al. |
| 2003/0123307 | A1 | 7/2003 | Lee et al. |
| 2003/0124873 | A1 | 7/2003 | Xing et al. |
| 2003/0183869 | A1 | 10/2003 | Crivelli et al. |
| 2003/0219947 | A1 | 11/2003 | Shin et al. |
| 2004/0094793 | A1 | 5/2004 | Noguchi et al. |
| 2004/0104424 | A1 | 6/2004 | Yamazaki |

(56) References Cited

U.S. PATENT DOCUMENTS

| | | |
|---|---|---|
| 2004/0110390 A1 | 6/2004 | Takagi et al. |
| 2004/0119108 A1 | 6/2004 | Chang |
| 2004/0129988 A1 | 7/2004 | Rotondaro et al. |
| 2004/0173918 A1 | 9/2004 | Kamal et al. |
| 2004/0183091 A1 | 9/2004 | Hibino |
| 2004/0183122 A1 | 9/2004 | Mine et al. |
| 2004/0207002 A1 | 10/2004 | Ryu et al. |
| 2004/0227198 A1 | 11/2004 | Mitani et al. |
| 2004/0251489 A1 | 12/2004 | Jeon et al. |
| 2004/0264236 A1* | 12/2004 | Chae ............... H01L 21/28194 365/154 |
| 2005/0026637 A1 | 2/2005 | Fischer et al. |
| 2005/0056892 A1 | 3/2005 | Seliskar |
| 2005/0062098 A1* | 3/2005 | Mahajani ........ H01L 21/28185 257/324 |
| 2005/0070126 A1 | 3/2005 | Senzaki |
| 2005/0093054 A1 | 5/2005 | Jung |
| 2005/0098839 A1 | 5/2005 | Lee et al. |
| 2005/0110102 A1 | 5/2005 | Wang et al. |
| 2005/0116279 A1 | 6/2005 | Koh |
| 2005/0141168 A1 | 6/2005 | Lee et al. |
| 2005/0186741 A1 | 8/2005 | Roizin et al. |
| 2005/0205920 A1 | 9/2005 | Jeon et al. |
| 2005/0227501 A1 | 10/2005 | Tanabe et al. |
| 2005/0236679 A1 | 10/2005 | Hori et al. |
| 2005/0245034 A1 | 11/2005 | Fukuda et al. |
| 2005/0266637 A1 | 12/2005 | Wang |
| 2005/0275010 A1 | 12/2005 | Chen et al. |
| 2005/0275012 A1 | 12/2005 | Nara et al. |
| 2006/0017092 A1 | 1/2006 | Dong et al. |
| 2006/0035432 A1 | 2/2006 | Kim et al. |
| 2006/0051880 A1 | 3/2006 | Doczy et al. |
| 2006/0065919 A1 | 3/2006 | Fujiwara |
| 2006/0081331 A1 | 4/2006 | Campian |
| 2006/0111805 A1 | 5/2006 | Yokoyama et al. |
| 2006/0113586 A1 | 6/2006 | Wang |
| 2006/0113605 A1 | 6/2006 | Currie |
| 2006/0113627 A1 | 6/2006 | Chen et al. |
| 2006/0192248 A1 | 8/2006 | Wang |
| 2006/0202261 A1 | 9/2006 | Lue et al. |
| 2006/0220106 A1 | 10/2006 | Choi et al. |
| 2006/0228899 A1 | 10/2006 | Nansei et al. |
| 2006/0228907 A1 | 10/2006 | Cheng et al. |
| 2006/0261401 A1 | 11/2006 | Bhattacharyya |
| 2006/0281331 A1 | 12/2006 | Wang |
| 2006/0284236 A1 | 12/2006 | Bhattacharyya |
| 2006/0292781 A1 | 12/2006 | Lee |
| 2007/0012988 A1 | 1/2007 | Bhattacharyya |
| 2007/0018201 A1 | 1/2007 | Specht et al. |
| 2007/0048916 A1 | 3/2007 | Suzuki et al. |
| 2007/0051306 A1 | 3/2007 | Ivanov et al. |
| 2007/0066087 A1 | 3/2007 | Jung |
| 2007/0087503 A1 | 4/2007 | Lusky |
| 2007/0108497 A1 | 5/2007 | Shih et al. |
| 2007/0121380 A1 | 5/2007 | Thomas |
| 2007/0132054 A1 | 6/2007 | Arghavani et al. |
| 2007/0210371 A1 | 8/2007 | Hisamoto et al. |
| 2007/0215940 A1 | 9/2007 | Ligon |
| 2007/0272971 A1 | 11/2007 | Lee et al. |
| 2008/0029399 A1 | 2/2008 | Tomita et al. |
| 2008/0032475 A1 | 2/2008 | Joshi et al. |
| 2008/0048237 A1 | 2/2008 | Iwata |
| 2008/0087942 A1 | 4/2008 | Hsu et al. |
| 2008/0090350 A1 | 4/2008 | Yan et al. |
| 2008/0093661 A1* | 4/2008 | Joo .................... H01L 29/4234 257/324 |
| 2008/0096349 A1* | 4/2008 | Park ................. H01L 21/02178 438/257 |
| 2008/0099830 A1* | 5/2008 | Lue ................... G11C 16/0466 257/324 |
| 2008/0121983 A1 | 5/2008 | Seong et al. |
| 2008/0146042 A1 | 6/2008 | Kostamo et al. |
| 2008/0150003 A1 | 6/2008 | Chen et al. |
| 2008/0173928 A1 | 7/2008 | Arai et al. |
| 2008/0175053 A1 | 7/2008 | Lue et al. |
| 2008/0237684 A1 | 10/2008 | Specht et al. |
| 2008/0237694 A1 | 10/2008 | Specht et al. |
| 2008/0258203 A1 | 10/2008 | Happ et al. |
| 2008/0272424 A1 | 11/2008 | Kim et al. |
| 2008/0290398 A1 | 11/2008 | Polishchuk et al. |
| 2008/0290399 A1 | 11/2008 | Levy et al. |
| 2008/0290400 A1 | 11/2008 | Jenne et al. |
| 2008/0291726 A1 | 11/2008 | Lue et al. |
| 2008/0293207 A1 | 11/2008 | Koutny et al. |
| 2008/0293254 A1 | 11/2008 | Ramkumar et al. |
| 2008/0293255 A1 | 11/2008 | Ramkumar |
| 2008/0296661 A1 | 12/2008 | Ramkumar et al. |
| 2008/0296664 A1 | 12/2008 | Ramkumar et al. |
| 2008/0296693 A1 | 12/2008 | Richter et al. |
| 2009/0001352 A1 | 1/2009 | Han et al. |
| 2009/0011609 A1 | 1/2009 | Ramkumar et al. |
| 2009/0032863 A1 | 2/2009 | Levy et al. |
| 2009/0039414 A1 | 2/2009 | Lue et al. |
| 2009/0045452 A1 | 2/2009 | Lue et al. |
| 2009/0057752 A1 | 3/2009 | Wang et al. |
| 2009/0061572 A1 | 3/2009 | Hareland et al. |
| 2009/0078990 A1 | 3/2009 | Yasuda |
| 2009/0086548 A1 | 4/2009 | Wu et al. |
| 2009/0104780 A1 | 4/2009 | Lee |
| 2009/0152621 A1 | 6/2009 | Polishchuk et al. |
| 2009/0179253 A1 | 7/2009 | Levy et al. |
| 2009/0179254 A1 | 7/2009 | Schaijk et al. |
| 2009/0181530 A1 | 7/2009 | Lisiansky et al. |
| 2009/0206385 A1 | 8/2009 | Kim et al. |
| 2009/0227116 A1 | 9/2009 | Joo et al. |
| 2010/0112769 A1 | 5/2010 | Son et al. |
| 2010/0117139 A1 | 5/2010 | Lue |
| 2010/0140684 A1 | 6/2010 | Ozawa |
| 2010/0155823 A1 | 6/2010 | Lue et al. |
| 2010/0200908 A1 | 8/2010 | Lee et al. |
| 2010/0252877 A1 | 10/2010 | Nakanishi et al. |
| 2010/0276667 A1 | 11/2010 | Kim et al. |
| 2011/0018053 A1 | 1/2011 | Lo et al. |
| 2011/0163371 A1 | 7/2011 | Song et al. |
| 2011/0248332 A1 | 10/2011 | Levy et al. |
| 2011/0275182 A1 | 11/2011 | Mouli |
| 2012/0037977 A1 | 2/2012 | Lee et al. |
| 2012/0068159 A1 | 3/2012 | Fujiki et al. |
| 2012/0068242 A1 | 3/2012 | Shin et al. |
| 2013/0175599 A1 | 7/2013 | Yang et al. |
| 2013/0175600 A1 | 7/2013 | Jenne et al. |
| 2013/0175604 A1 | 7/2013 | Polishchuk et al. |
| 2016/0300959 A1 | 10/2016 | Jenne et al. |

FOREIGN PATENT DOCUMENTS

| | | |
|---|---|---|
| KR | 20040070669 A | 8/2004 |
| TW | 200703671 A | 1/2007 |
| WO | 2011162725 A1 | 12/2011 |

OTHER PUBLICATIONS

SIPO Office Action for International Application No. 201380032545.4 dated Nov. 12, 2018; 6 pages.
International Search Report for International Application No. PCT/US07/20988 dated Mar. 14, 2008; 2 pages.
SIPO Office Action for Chinese Application No. 200780037848.X dated Jan. 30, 2012; 6 pages.
SIPO Office Action for Chinese Application No. 200780037848.X dated Nov. 12, 2010; 2 pages.
TIPO Office Action for International Application No. 102110453 dated Feb. 9, 2017; 12 pages.
TIPO Office Action for International Application No. 102110453 dated Oct. 21, 2016; 20 pages.
TIPO Office Action for Taiwan Application No. 096136689.0 dated Feb. 21, 2014; 2 pages.
TIPO Office Action for Taiwan Application No. 096136689.0 dated Aug. 9, 2013; 5 pages.
USPTO Advisory Action for U.S. Appl. No. 13/114,889 dated May 6, 2014; 3 pages.

(56) References Cited

OTHER PUBLICATIONS

USPTO Advisory Action for U.S. Appl. No. 13/114,889 dated Aug. 2, 2013; 2 pages.
USPTO Advisory Action for U.S. Appl. No. 13/114,889 dated Aug. 29, 2012; 3 pages.
USPTO Advisory Action for U.S. Appl. No. 13/436,875 dated Sep. 17, 2015; 3 pages.
USPTO Advisory Action for U.S. Appl. No. 13/436,875 dated Oct. 24, 2014; 3 pages.
USPTO Final Rejection for U.S. Appl. No. 11/904,513 dated Jun. 24, 2009; 12 pages.
USPTO Final Rejection for U.S. Appl. No. 12/030,644 dated Jan. 24, 2011; 22 pages.
USPTO Final Rejection for U.S. Appl. No. 13/114,889 dated Feb. 11, 2014; 17 pages.
USPTO Final Rejection for U.S. Appl. No. 13/114,889 dated Apr. 2, 2013; 12 pages.
USPTO Final Rejection for U.S. Appl. No. 13/114,889 dated Jun. 4, 2012; 12 pages.
USPTO Final Rejection for U.S. Appl. No. 13/436,875 dated Jun. 23, 2015; 21 pages.
USPTO Final Rejection for U.S. Appl. No. 13/436,875 dated Aug. 8, 2014; 12 pages.
USPTO Miscellaneous Internal Document for U.S. Appl. No. 12/030,644 dated May 28, 2010; 6 pages.
USPTO Non Final Rejection for U.S. Appl. No. 11/904,513 dated Dec. 10, 2008; 11 pages.
USPTO Non Final Rejection for U.S. Appl. No. 13/114,889 dated Sep. 5, 2013; 11 pages.
USPTO Non Final Rejection for U.S. Appl. No. 13/114,889 dated Nov. 25, 2011; 13 pages.
USPTO Non-Final Rejection for U.S. Appl. No. 12/030,644 dated May 28, 2010; 19 pages.
USPTO Non-Final Rejection for U.S. Appl. No. 13/114,889 dated Oct. 10, 2012; 11 pages.
USPTO Non-Final Rejection for U.S. Appl. No. 13/436,875 dated Jan. 15, 2015; 21 pages.
USPTO Non-Final Rejection for U.S. Appl. No. 13/436,875 dated Feb. 21, 2014; 14 pages.
USPTO Non-Final Rejection for U.S. Appl. No. 13/436,875 dated Oct. 5, 2015; 19 pages.
USPTO Non-Final Rejection for U.S. Appl. No. 15/252,059 dated Apr. 19, 2018; 20 pages.
USPTO Notice of Allowance for U.S. Appl. No. 11/904,513 dated Oct. 9, 2009; 7 pages.
USPTO Notice of Allowance for U.S. Appl. No. 13/114,889 dated Jun. 19, 2014; 9 pages.
USPTO Notice of Allowance for U.S. Appl. No. 13/436,875 dated Jan. 5, 2016; 5 pages.
USPTO Notice of Allowance for U.S. Appl. No. 13/436,875; dated Apr. 22, 2016; 8 pages.
USPTO Requirement for Restriction for U.S. Appl. No. 11/904,513 dated Oct. 7, 2008; 8 pages.
USPTO Requirement for Restriction for U.S. Appl. No. 12/030,644 dated Oct. 7, 2009; 11 pages.
USPTO Requirement for Restriction for U.S. Appl. No. 13/114,889; dated Sep. 7, 2011; 6 pages.
USPTO Requirement for Restriction for U.S. Appl. No. 13/436,875; dated Oct. 18, 2013; 8 pages.
USPTO Restriction Requirement for U.S. Appl. No. 15/252,059 dated Nov. 30, 2017; 6 pages.
Wang, Szu-Yu et al., "Reliability and processing effects of bandgap engineered SONOS flash memory", 2007 IEEE, Interntaional Reliability Symposium, Apr. 18, 2007, 5 pgs.
Written Opinion of the International Searching Authority for International Application No. PCT/US07/20988 dated Mar. 14, 2008; 1 page.
Wu et al., "SONOS Device with Tapered Bandgap Nitride Layer," IEEE Transactions on Electron Devices, May 2005, vol. 52, No. 5, pp. 987-992; 6 pages.

Yang et al., "Reliability considerations in scaled SONOS nonvolatile memory devices, solid state Electronics", 43(1999) 2025-2032.
"Implementation of High K/Metal Gates in High Volume Manufacturing," Applied Materials, accessed from http://www.tel.uva.es/descargar.htm?id=6134 ; 5 pages.
Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.
Hung et al., High-performance gate-all-around polycrystalline silicon nanowire with silicon nanocrystals nonvolatile memory, Appl. Phys. Lett, 98 162108 (2011), pub date: Apr. 22, 2011.
International Search Report for International Application No. PCT/US07/20966 dated Apr. 21, 2008; 2 pages.
International Search Report for International Application No. PCT/US2013/048874 dated Dec. 16, 2013; 2 pages.
Jeong-Mo Hwang, "Bringing Non-Volatile Memory Blocks to SOCS Using the SONOS Process", Simtek Corporation; 11 pages.
Lue et al., "BE-SONOS: A Bandgap Engineered SONOS with Excellent Performance and Reliability," IEEE, 2005; 4 pages.
Lue, Hang-Ting et al., "Reliability Model of Bandgap Engineered SONOS (be-SONOS)", IEEE, 2006, 4 pgs.
SIPO Office Action for Application No. 200780035963.3 dated Feb. 29, 2012; 4 pages.
SIPO Office Action for International Application No. 2013800325454 dated Dec. 2, 2016; 5 pages.
SIPO Office Action for International Application No. 201380032545.4 dated Feb. 23, 2018; 7 pages.
SIPO Office Action for International Application No. 2013800325454 dated Aug. 10, 2017; 8 pages.
Sun, Y., et al., "Multibit Programmable Flash Memory Realized on Vertical Si Nanowire Channel", IEEE Electron Device Letters, IEEE, vol. 31, Issue 5, May 2010.
TIPO Office Action for Application No. 111203859-TW dated Aug. 23, 2013; 6 pages.
TIPO Office Action for International Application No. 102123446 dated Mar. 10, 2017; 11 pages.
USPTO Advisory Action for U.S. Appl. No. 11/904,506 dated Aug. 30, 2011; 4 pages.
USPTO Final Rejection for U.S. Appl. No. 11/904,506 dated Jun. 7, 2011; 15 pages.
USPTO Final Rejection for U.S. Appl. No. 13/539,461 dated Jun. 4, 2015; 9 pages.
USPTO Final Rejection for U.S. Appl. No. 15/051,279 dated Feb. 9, 2017; 8 pages.
USPTO Non Final Rejection for U.S. Appl. No. 11/904,506 dated Feb. 3, 2011; 13 pages.
USPTO Non Final Rejection for U.S. Appl. No. 11/904,506 dated Aug. 31, 2010; 17 pages.
USPTO Non-Final Rejection for U.S. Appl. No. 13/539,461 dated Jan. 2, 2015; 14 pages.
USPTO Non-Final Rejection for U.S. Appl. No. 15/051,279 dated Dec. 30, 2016; 9 pages.
USPTO Non-Final Rejection for U.S. Appl. No. 15/051,279 dated Sep. 27, 2017; 7 pages.
USPTO Notice of Allowance for U.S. Appl. No. 11/904,506 dated Sep. 16, 2013; 8 pages.
USPTO Notice of Allowance for U.S. Appl. No. 11/904,506 dated Oct. 28, 2013; 9 pages.
USPTO Notice of Allowance for U.S. Appl. No. 13/539,461 dated Aug. 13, 2015; 7 pages.
USPTO Notice of Allowance for U.S. Appl. No. 13/539,461 dated Nov. 24, 2015; 7 pages.
USPTO Notice of Allowance for U.S. Appl. No. 15/051,279 dated Feb. 14, 2018; 9 pages.
USPTO Requirement for Restriction for U.S. Appl. No. 11/904,506 dated Apr. 13, 2010; 7 pages.
Witten Opinion of the International Searching Authority for International Application No. PCT/US07/20966 dated Apr. 21, 2008; 1 pages.
Witten Opinion of the International Searching Authority for International Application No. PCT/US2013/048874 dated Dec. 16, 2013; 7 pages.

(56) References Cited

OTHER PUBLICATIONS

USPTO Non-Final Rejection for U.S. Appl. No. 15/252,059 dated Mar. 4, 2019; 26 pages.
Korean Intellectual Property Office Office Action for international application 10-2014-7035194 dated Mar. 28, 2019, 9 pages.

* cited by examiner

SONOS ONO STACK SCALING

CROSS-REFERENCE TO RELATED APPLICATIONS

This application is a continuation of U.S. application Ser. No. 15/051,279, filed on Feb. 23, 2016, which is a continuation of U.S. application Ser. No. 13/539,461, filed Jul. 1, 2012, now U.S. Pat. No. 9,299,568, issued on Mar. 29, 2016, which is a continuation-in-part of U.S. application Ser. No. 11/904,506, filed Sep. 26, 2007, now U.S. Pat. No. 8,614,124, issued on Dec. 24, 2013, which claims the benefit of priority under 35 U.S.C. 119(e) to U.S. Provisional Patent Application Ser. No. 60/940,384, filed May 25, 2007, all of which are incorporated by reference herein.

TECHNICAL FIELD

Embodiments of the present invention relate to the electronics manufacturing industry and more particularly to fabrication of nonvolatile trapped-charge memory devices.

BACKGROUND

FIG. 1 is a partial cross-sectional view of an intermediate structure for a semiconductor device 100 having a semiconductor-oxide-nitride-oxide-semiconductor (SONOS) gate stack 102 including a conventional oxide-nitride-oxide (ONO) stack 104 formed over a surface 106 of a semiconductor substrate 108 according to a conventional method. The device 100 typically further includes one or more diffusion regions 110, such as source and drain regions, aligned to the gate stack and separated by a channel region 112. The SONOS gate stack 102 includes a poly-silicon (poly) gate layer 114 formed upon and in contact with the ONO stack 104. The poly gate 114 is separated or electrically isolated from the substrate 108 by the ONO stack 104. The ONO stack 104 generally includes a silicon oxide tunneling layer 116, a silicon nitride charge trapping layer 118 which serves as a charge storing or memory layer for the device 100, and a silicon oxide blocking layer 120 overlying the charge trapping layer 118.

Such SONOS-type transistors are useful for non-volatile memory (NVM). The charge trapping layer stores charge to provide non-volatility. To program (i.e. write to) the n-channel SONOS-type device, a positive voltage is applied to the control gate (Vcg) while the source, body and drain are grounded. An energy band diagram, trapped charge distribution and trap density distribution of a conventional n-channel SONOS device having a channel 212, oxide tunneling layer 216, nitride memory layer 218 and oxide blocking layer 220 during programming is depicted in FIG. 2. As shown, the positive Vcg produces a field across the SONOS stack resulting in some negative charge at the conduction band energy level in the buried channel of silicon substrate channel to undergo Fowler-Nordheim tunneling (FNT) through the tunneling layer and into the charge trapping layer. The electrons are stored in traps having mid gap energy levels in the charge trapping nitride. As illustrated, the trap density distribution is substantially uniform throughout the charge trapping layer. As further shown, under bias, the trapped charge distribution is such that the majority of trapped charge is in the portion of the charge trapping layer (i.e. memory layer) proximate to the blocking oxide. To erase then-channel SONOS device, a negative voltage is applied to the control gate 314. An energy band diagram showing the channel 312, oxide tunneling layer 316, nitride memory layer 318 and oxide blocking layer 320 during erasing is depicted in FIG. 3. As shown, the negative Vcg produces a field across the SONOS stack attracting hole tunneling charge through the tunneling layer and into the charge trapping layer.

SONOS-type devices are gaining in popularity for high density memory applications, such as embedded NVM. It is known in the industry that uniform channel Fowler-Nordheim tunneling (FNT) and/or direct tunneling (DT) for program and erase result in improved reliability over other methods. A combination of FNT and DT is referred to here and is referred to as modified Fowler-Nordheim tunneling (MFNT). Currently, conventional SONOS operate in the 10 V range for MFNT. However, an advantage of SONOS over other NVM devices is voltage scalability. It has been theorized, with proper scaling, there exists potential in SONOS to achieve a memory technology operable in the 5 volt (V) range, rather than the 10 V range of conventional SONOS-type devices or 12 V-15 V range of conventional flash technology. SONOS-type devices operable at low voltages (approaching 5 V) are advantageously compatible with low voltage CMOS. Alternatively, faster programming or erasing may be possible at a particular voltage for a scaled device. However, successful scaling of SONOS-type devices is non-trivial. For example, FIG. 4 depicts programming and erase times for a conventional SONOS device employing a conventional ONO stack comprised of a 10 nm thick silicon dioxide blocking layer, a 7 nm thick silicon nitride charge trapping layer, and a 3 nm thick silicon dioxide tunneling layer. As shown, the programming/erase time increases dramatically when Vcg is scaled down. Generally, program/erase times less than 1 millisecond (ms) are desirable for embedded memory applications. However, such 1 ms program/erase times may be achieved in the conventional SONOS stack only with a Vcg of +/−10 V. Conventional SONOS program/erase times extend to 100 ms or more when Vcg is reduced to approximately +/−9 v.

Furthermore, reducing the programming voltage results in a reduction of the erase or program window (i.e. memory window). This is because the electric field is across the ONO stack is reduced if the equivalent oxide thickness (EOT) of the entire ONO stack is not scaled down as the voltage is reduced. Reducing the EOT of the stack is non-trivial because reducing the tunneling layer thickness to allow the same initial erase level at a lower applied voltage (Vcg) can result in a detrimental increase in the erase and program decay rate Similarly, if the charge trapping layer thickness is reduced, the charge centroid is placed closer to the substrate, increasing charge loss to the substrate. Finally, when the blocking oxide thickness is scaled down, the electron reverse injection from the control gate is increased, causing damage to the ONO stack and data retention loss. Reverse injection is manifested as further shown in FIG. 4, where the FNT erase reaches "saturation." This occurs when electrons are back streamed from the gate into the memory layer faster than they can be removed via hole transport across the tunnel oxide. Accordingly, there remains a need to scale the ONO stack of a SONOS device in a manner capable of providing a device operable at a lower program/erase voltage.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
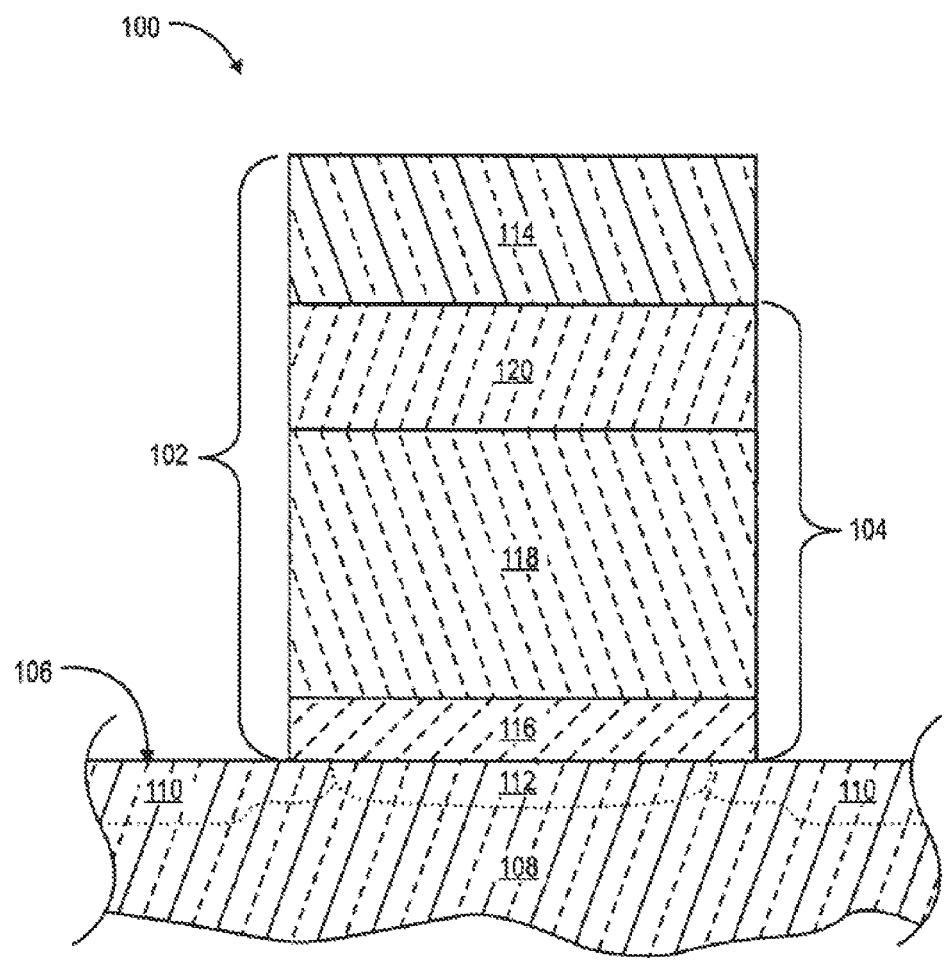
FIG. 1 illustrates a cross sectional view of an intermediate structure for a conventional SONOS device.
Figure 2:
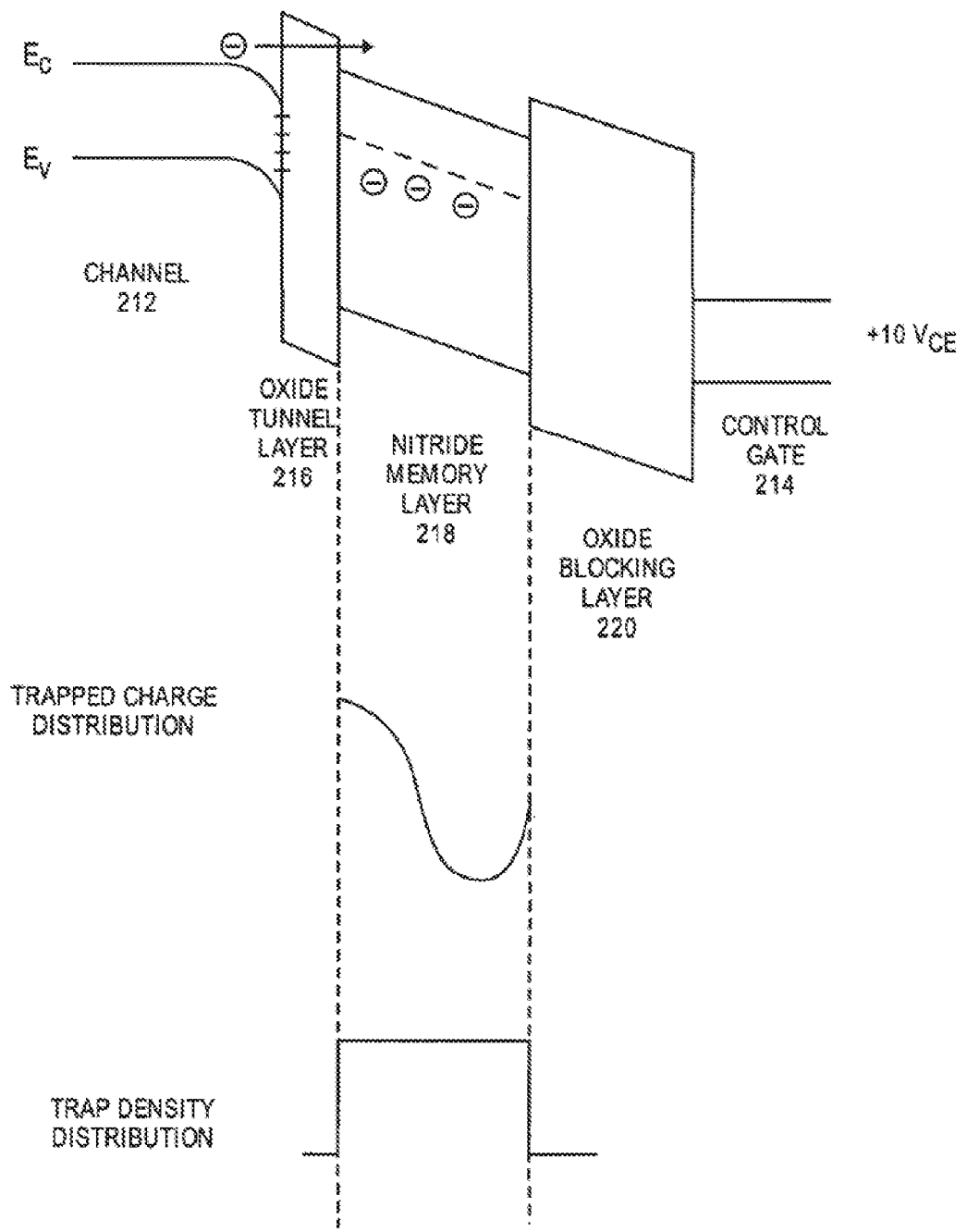
FIG. 2 depicts an energy band diagram, trapped charge distribution and trap density distribution of a conventional SONOS device during program.
Figure 3:
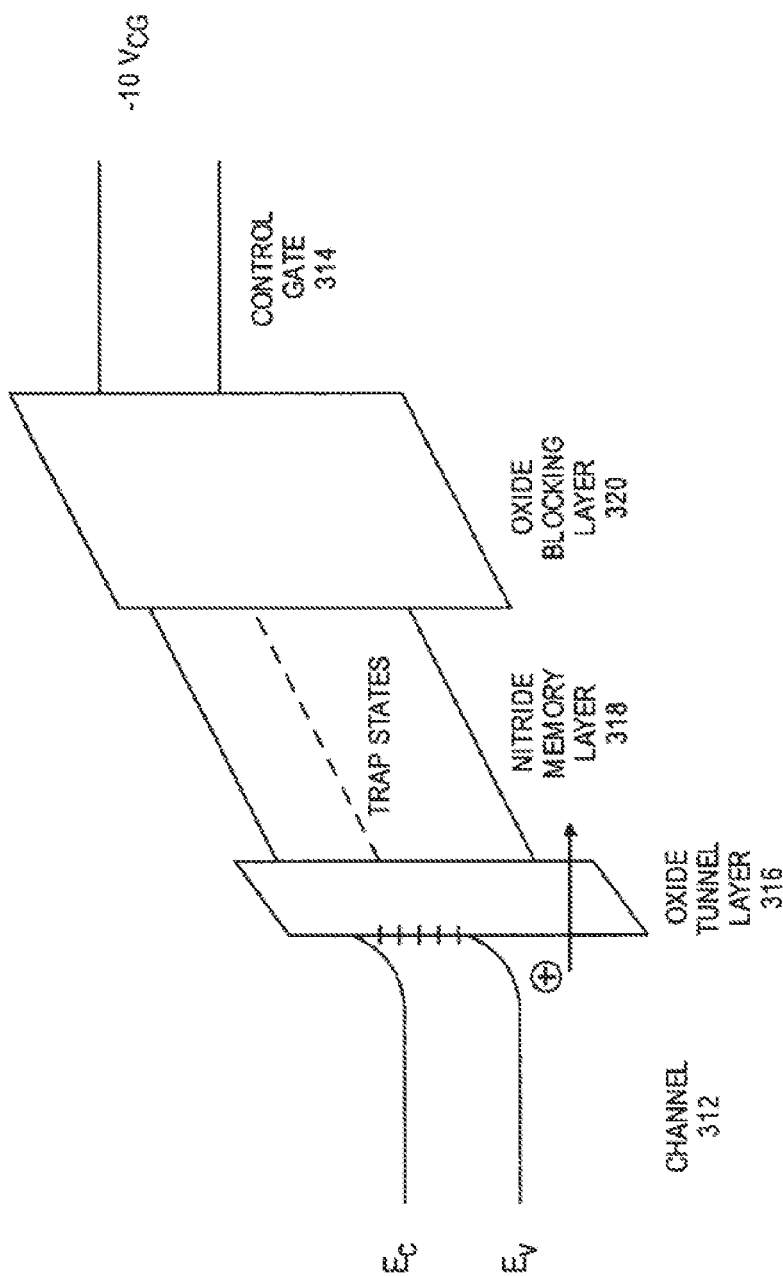
FIG. 3 depicts an energy band diagram of a conventional SONOS device during erase.
Figure 4:
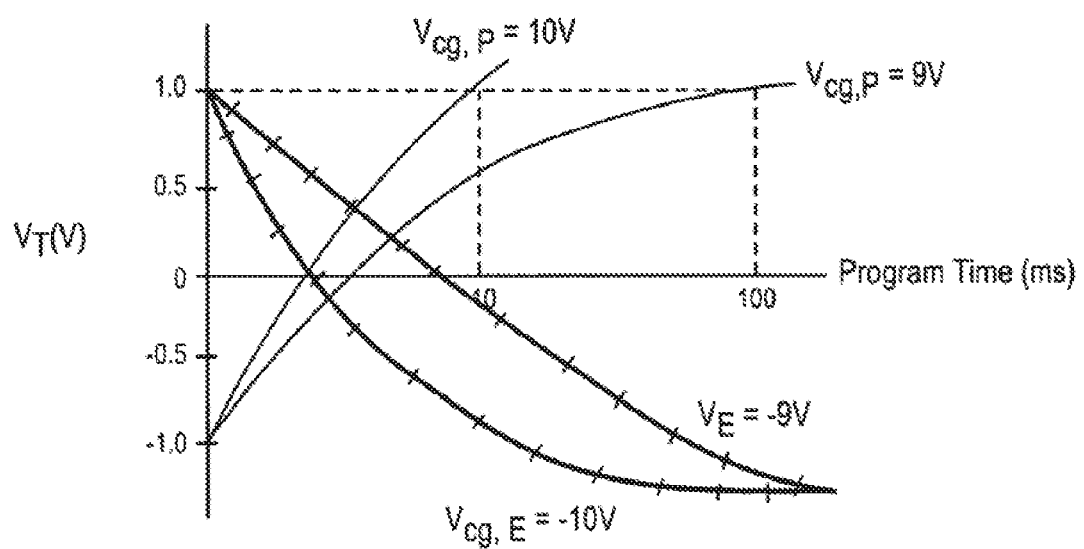
FIG. 4 depicts programming and erase times for a conventional SONOS device employing a conventional ONO stack.

Embodiments of scaling a nonvolatile trapped-charge memory device are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Certain embodiments of the present invention include a scaled SONOS-type device. In particular embodiments of the present invention, the tunneling layer, charge trapping layer and blocking layer are modified to scale the SONOS-type device. In particular embodiments, the scaled SONOS device is operable at programming and erase voltages below +/−10 V. In certain such embodiments, the scaled SONOS device is operated with an erase voltage between −5 V and −9 V, and preferably between −5 V and −7 V, to provide an initial erase voltage threshold level (VTE) of −1 to −3 V and preferably −2 to −3 after a 1 ms-10 ms pulse when operated at temperature of between −40 to 95 degrees Celsius (° C.). In other specific embodiments, the SONOS-type device is operated with a programming voltage between 5 V and 9V, and preferably between 5 V and 7 V, to provide an initial program voltage threshold level (VTP) of 1 V to 3 V, preferably 2 V to 3 V, after a 1 ms to 10 ms, preferably 5 ms, programming pulse. These exemplary scaled SONOS devices providing an end of life (EOL) memory window of between 1 V and 2 V after 20 years at 85° C. and at least 10,000 write/erase cycles, preferably 100,000 cycles.

In certain embodiments, a conventional pure oxygen (oxide) tunneling layer is replaced with a nitridized oxide having a particular nitrogen concentration profile to reduce the equivalent oxide thickness of the tunneling layer relative to the pure oxygen tunneling layer while retaining low interface trap density. This enables reducing (scaling) the programming/erase voltages while providing an erase voltage threshold level (VTPNTE) as good or better than a conventional, non-scaled device. In particular other embodiments, the conventional charge trapping layer of nitride is replaced with a multi-layer oxynitride film having at least a top and bottom layer of distinct stoichiometry. In one such embodiment, the multi-layer oxynitride includes a silicon-rich, oxygen-lean top layer to locate and confine the centroid of charge away from the tunnel oxide layer, thereby locally increasing trap density within the charge trapping layer. In particular other embodiments, the conventional blocking layer of high temperature oxide (HTO) is replaced with a reoxidized blocking layer to densify the blocking oxide and thereby reduce the memory decay rate with scaling. Such embodiments provide sufficient net charge for an adequate memory window while also reducing trap assisted tunneling to improve or maintain programming and erase threshold voltages (VTPNTE) when the SONOS device is operated at a reduced program/erase voltage.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

In accordance with one embodiment of the present invention, the nonvolatile trapped-charge memory device is a SONOS-type device wherein a charge-trapping layer is an insulator layer, such as a nitride. In another embodiment, the nonvolatile trapped-charge memory device is a Flash-type device wherein the charge-trapping layer is a conductor layer or a semiconductor layer, such as poly-silicon. Nonvolatile trapped-charge memory devices employing the nitridized oxide tunneling layer may enable a lower programming or erase voltage while providing an erase voltage threshold level (VTPNTE) as good as or better than a conventional device.

Figure 5:
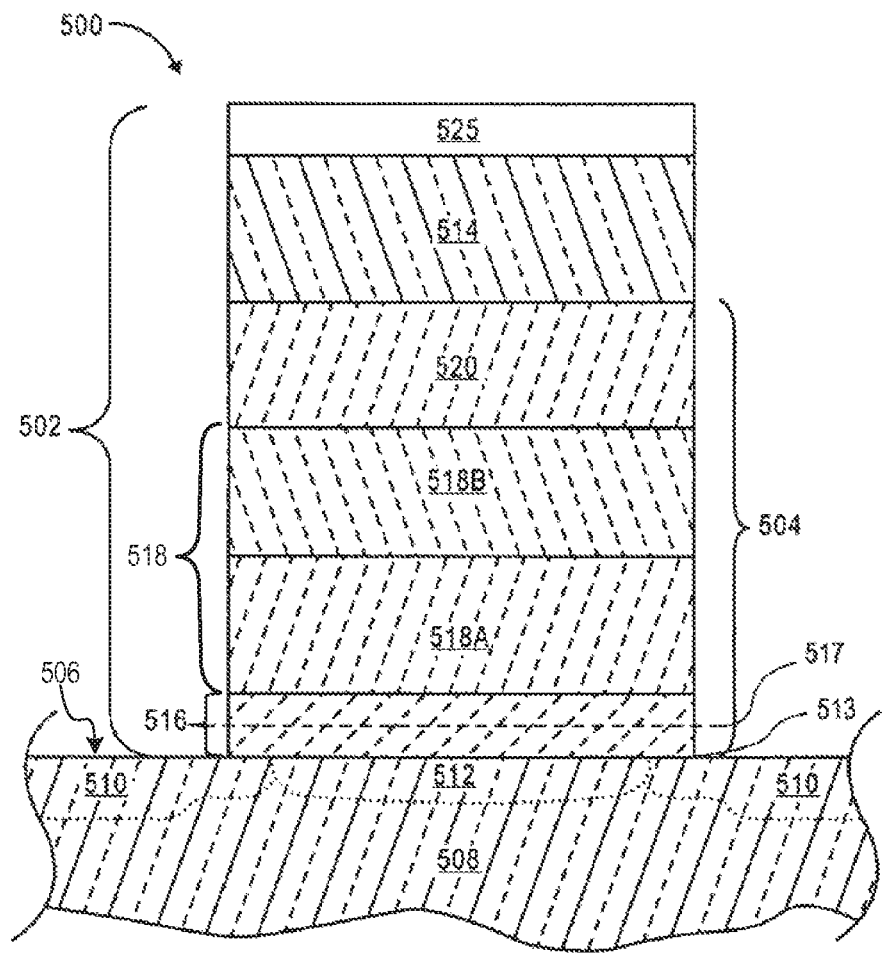
FIG. 5 illustrates a cross-sectional side view of a portion of a scaled nonvolatile trapped-charge memory device having a scaled ONO structure including a nitridized oxide tunneling layer, a multi-layer oxynitride charge trapping layer and a densified blocking layer according to an embodiment of the present invention.

FIG. 5 illustrates a cross-sectional side view of an intermediate structure of a SONOS-type device 500 having a scaled ONO stack according to an embodiment of the present invention. It should be appreciated that various other SONOS embodiments disclosed herein may also be employed to produce a scaled ONO stack beyond the specific embodiment depicted in FIG. 5, but nonetheless also operable at a reduced program/erase voltage. Thus, while the features of FIG. 5 may be referenced throughout the description, the present invention is not limited to this particular embodiment.

In the specific embodiment shown in FIG. 5, the SONOS-type device 500 includes a SONOS gate stack 502 including an ONO stack 504 formed over a surface 506 of a substrate 508. SONOS-type device 500 further includes one or more source and drain regions 510, aligned to the gate stack 502 and separated by a channel region 512. Generally, the scaled SONOS gate stack 502 includes a gate layer 514 formed upon and in contact with the scaled ONO stack 504 and a portion of the substrate 508. The gate layer 514 is separated or electrically isolated from the substrate 508 by the scaled ONO stack 504.

In one embodiment, substrate 508 is a bulk substrate comprised of a single crystal of a material which may include, but is not limited to, silicon, germanium, silicon-germanium or a III-V compound semiconductor material. In another embodiment, substrate 508 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In another embodiment, substrate 508 is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxy-nitride. The lower bulk layer is comprised of a single crystal which may include, but is not limited to, silicon, germanium, silicon/germanium, a III-V compound semiconductor material and quartz. Substrate 508 and, hence, the channel region 512 between the source and drain regions 510, may comprise dopant impurity atoms. In a specific embodiment, the channel region is doped P-type and, in an alternative embodiment, the channel region is doped N-type.

Source and drain regions 510 in substrate 508 may be any regions having opposite conductivity to the channel region 512. For example, in accordance with an embodiment of the present invention, source and drain regions 510 are N-type doped while channel region 512 is P-type doped. In one embodiment, substrate 508 is comprised of boron-doped single-crystal silicon having a boron concentration in the range of $1\times10^{15}$-$1\times10^{19}$ atoms/cm$^3$. Source and drain regions 510 are comprised of phosphorous or arsenic doped regions having a concentration of N-type dopants in the range of $5\times10^{16}$-$5\times10^{19}$ atoms/cm$^3$. In a specific embodiment, source and drain regions 510 have a depth in substrate 508 in the range of 80-200 nanometers. In accordance with an alternative embodiment of the present invention, source and drain regions 510 are P-type doped while the channel region of substrate 508 is N-type doped. The SONOS-type device 500 further includes, over channel region 512, a gate stack 502 including an ONO stack 504, a gate layer 514 and a gate cap layer 525. The ONO stack 504 further includes tunneling layer 516, a charge trapping layer 518 and a blocking layer 520.

In an embodiment, the tunneling layer 516 includes a nitridized oxide. Because programming and erase voltages produce large electric fields across a tunneling layer, on the order of 10 MV/cm, the program/erase tunneling current is more a function of the tunneling layer barrier height than the tunneling layer thickness. However, during retention, there is no large electric field present and so the loss of charge is more a function of the tunneling layer thickness than barrier height. To improve tunneling current for reduced operating voltages without sacrificing charge retention, in a particular embodiment, the tunneling layer 516 is a nitridized oxide. Nitridation increases the relative permittivity or dielectric constant ($\varepsilon$) of the tunneling layer by inducing nitrogen to an otherwise pure silicon dioxide film. In certain embodiments, the tunneling layer 516 of nitridized oxide has the same physical thickness as a conventional SONOS-type device employing pure oxygen tunnel oxide. In particular embodiments, nitridation provides a tunnel layer with an effective ($\varepsilon$) between 4.75 and 5.25, preferably between 4.90 and 5.1 (at standard temperature). In one such embodiment, nitridation provides a tunnel layer with an effective ($\varepsilon$) of 5.07, at standard temperature.

In certain embodiments, the nitridized tunnel oxide of the scaled SONOS device has the same physical thickness as a conventional, non-scaled SONOS device employing pure oxygen tunnel oxide. Generally, the higher permittivity of the nitridized tunnel oxide results in the memory layer charging faster. In such embodiments, the charge trapping layer 518 charges during program/erase faster than a pure oxygen tunnel oxide of that thickness because relatively less of the large electric field from the control gate is dropped across the nitridized tunnel oxide (due to the relatively higher permittivity of nitridized tunnel oxide). These embodiments allow the SONOS-type device 500 to operate with a reduced program/erase voltage while still achieving the same program/erase voltage threshold level (VTPNTE) as a conventional SONOS-type device. In a particular embodiment, the SONOS-type device 500 employs a tunneling layer 516 having nitridized tunnel oxide with a physical thickness between 1.5 nm and 3.0 nm, and preferably between 1.9 nm and 2.2 nm.

Figure 6:
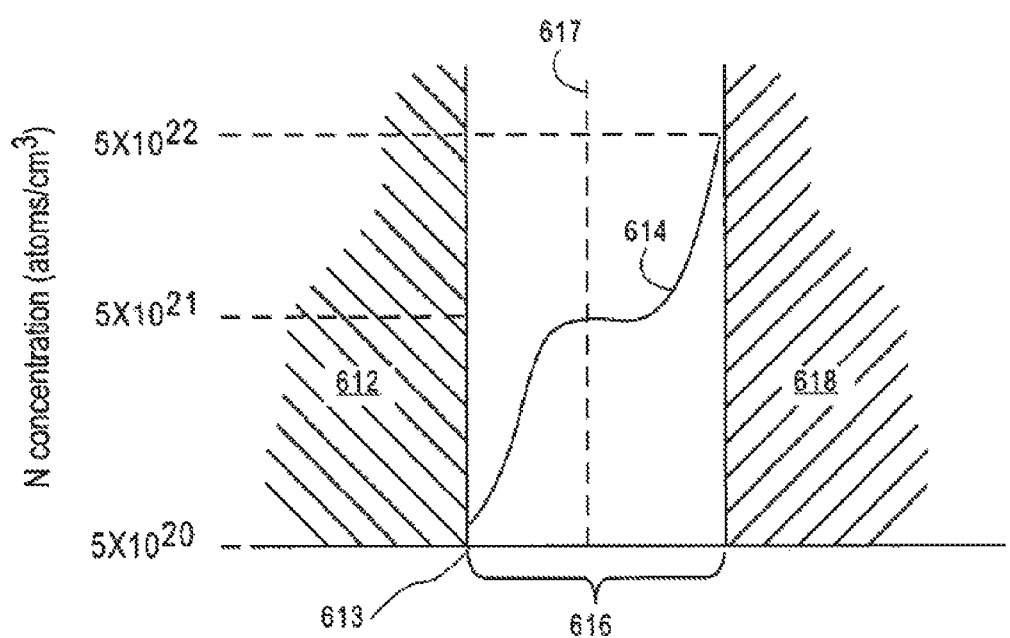
FIG. 6 illustrates an approximate nitrogen concentration profile of the nitridized oxide tunneling layer in accordance with an embodiment of the present invention.

In a further embodiment, the tunneling layer 516 is nitridized in a particular manner to reduce the trap density at the substrate interface to improve charge retention. For particular embodiments in which the nitridized oxide tunneling layer is scaled to be the same physical thickness as a pure oxygen tunnel oxide, charge retention may be approximately the same as the pure oxygen tunnel oxide of the same thickness. Referring to FIG. 6, depicting an approximate nitrogen concentration profile within one embodiment of the tunneling layer 616, the nitrogen concentration 614 decreases rapidly toward the substrate interface 613 to limit the formation of a silicon nitride ($Si_2N_4$) layer in contact with the substrate 612. A silicon nitride layer, comprising polar molecules, detrimentally increases the trap density if present at the substrate interface 613, thereby reducing charge retention via trap to trap tunneling. Thus, by adjusting the nitrogen concentration within the nitridized tunnel oxide, the programming/erase Vcg may be reduced without a significant reduction in charge retention of the scaled SONOS device. As further shown in FIG. 6, 25% of the thickness of the tunneling layer 616 proximate to the interface 613, is nitridized to have a nitrogen concentration 614 less than about $5 \times 10^{21}$ nitrogen atoms/$cm^3$ while 25% of the thickness of the tunneling layer 616 proximate to the charge trapping layer 618 is nitridized to have at least $5 \times 10^{21}$ nitrogen atoms/$cm^3$.

In one embodiment, nitridization of oxide within the tunneling layer reduces its energy barrier and increases the dielectric constant relative to a pure oxide tunneling layer. As shown in FIG. 5, tunneling layer 516 is annotated for illustration purposes with a centerline 517. FIG. 6 depicts a similar centerline 617 with one half the thickness of the tunneling layer 616 proximate the substrate 612 and one half the thickness of the tunneling layer 616 proximate the charge trapping layer 620. In a particular embodiment, the nitrogen concentration 614 is below $5 \times 10^{21}$ atoms/$cm^3$ throughout the first 25% of the thickness of the tunneling layer 616 and reaches approximately $5 \times 10^{21}$ atoms/$cm^3$ at 50% of the thickness of the tunneling layer 616, or at the centerline 617. In a further embodiment, the nitrogen concentration 614 is above $5 \times 10^{21}$ atoms/cm3 within the last 25% of the thickness of the tunneling layer 616, proximate the charge trapping layer 618. In an exemplary implementation, for a 2.2 nm tunneling layer, the nitrogen concentration 614 is below $5 \times 10^{21}$ atoms/$cm^3$ within the first 0.6 nm of the tunneling layer proximate the substrate 612 and is at least $5 \times 10^{21}$ atoms/$cm^3$ at 1.1 nm of the tunneling layer 616 thickness. In this manner, the capacitance of the tunneling layer may be increased without a significant reduction in charge retention of a scaled SONOS-type device.

Figure 7A:
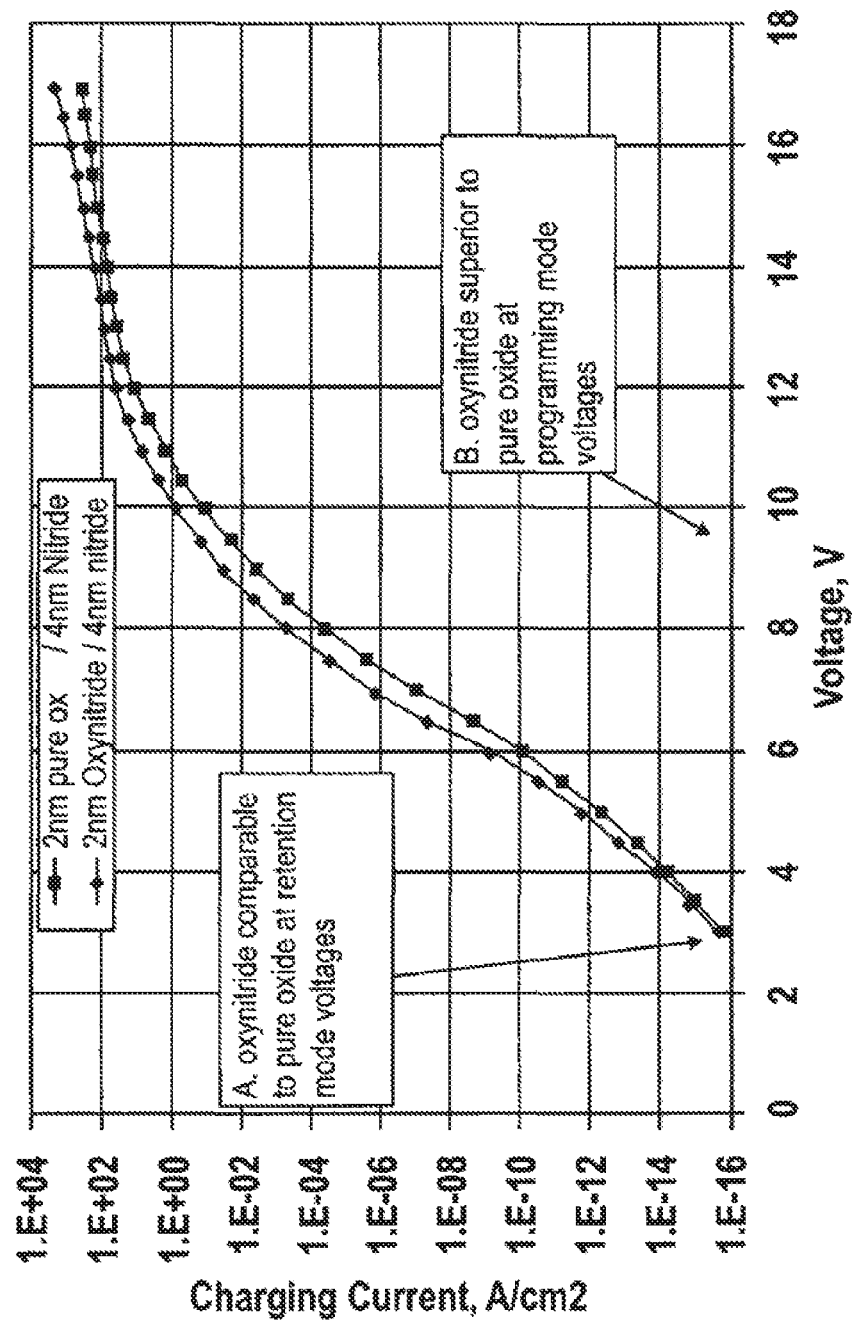
FIG. 7A illustrates a graph depicting simulation showing reduction in programming voltage attributable to a nitridized oxide tunneling layer in accordance with an embodiment of the present invention.

FIG. 7A illustrates a graph depicting a simulation showing a reduction in programming voltage attributable to a nitridized oxide tunneling layer in accordance with an embodiment of the present invention. As shown, leakage current at retention voltages for 20 Å pure oxide tunneling layer and 40 Å nitride charge trapping layer is equal to 20 Å nitridized oxide tunneling layer and 40 Å charge trapping layer nitride, while charging current for the nitridized oxide tunneling layer at programming voltages is greater than that of the pure oxide tunneling layer. Thus, at a program or erase voltage of 9.1 V, a nitridized oxide tunneling layer in accordance with the present invention may provide the same program erase level achieved with a 10 V program or erase voltage and a conventional pure oxide tunneling layer.

Referring back to FIG. 5, the charge trapping layer 518 of the SONOS-type device 500 may further include any commonly known charge trapping material and have any thickness suitable to store charge and, modulate the threshold voltage of the device. In certain embodiments, charge trapping layer 518 is silicon nitride ($SiN_4$), silicon-rich silicon nitride, or silicon-rich silicon oxynitride. The silicon-rich film includes daggling silicon bonds. In one particular embodiment, the charge trapping layer 518 has a non-uniform stoichiometry across the thickness of charge trapping layer. For example, the charge trapping layer 518 may further include at least two oxynitride layers having differing compositions of silicon, oxygen and nitrogen. Such compositional non-homogeneity within the charge trapping layer has a number of performance advantages over a conventional SONOS charge trapping layer having a substantially homogeneous composition. For example, reducing the thickness of the conventional SONOS charge trapping layer increases the trap to trap tunneling rate, resulting in a loss of data retention. However, when the stoichiometry of the charge trapping layer is modified in accordance with an embodiment of the present invention, the thickness of the charge trapping layer may be scaled down while still maintaining good data retention.

In a particular embodiment, the bottom oxynitride layer 518A provides a local region within the charge trapping layer having a relatively lower density of trap states, thereby reducing the trap density at the tunnel oxide interface to reduce trap assisted tunneling in the scaled SONOS device. This results in reduced stored charge loss for a given charge trapping layer thickness to enable scaling of the charge trapping layer for scaling of the ONO stack EOT. In one such embodiment, the bottom oxynitride 518A has a first composition with a high silicon concentration, a high oxygen concentration and a low nitrogen concentration to provide an oxygen-rich oxynitride. This first oxynitride may have a physical thickness between 2.5 nm and 4.0 nm corresponding to an EOT of between 1.5 nm and 5.0 nm. In one particular embodiment, the bottom oxynitride layer 518A has an effective dielectric constant ($\varepsilon$) of approximately 6.

In a further embodiment, a top oxynitride layer 518B provides a local region within the charge trapping layer having a relatively higher density of trap states. The relatively higher density of trap states enables a charge trapping layer of reduced thickness to provide sufficient trapped charge that the memory window remains adequate in the scaled ONO stack. Thus, the higher density of trap states has the effect of increasing the difference between programming and erase voltages of memory devices for a particular charge trapping layer thickness, allowing the charge trapping layer thickness to be reduced and thereby reducing the EOT of the ONO stack in the scaled SONOS device. In a particular embodiment, the composition of the top oxynitride layer has a high silicon concentration and a high nitrogen concentration with a low oxygen concentration to produce a silicon-rich, oxygen-lean oxynitride. Generally, the higher silicon content of the top oxynitride, the higher the density of trap states provided by the top oxynitride and the more the top oxynitride layer thickness can be reduced (thereby reducing the charge trapping layer thickness to enable lower voltage operation). Furthermore, the higher the silicon content, the greater the permittivity and the lower the EOT for the top oxynitride layer. This reduction in EOT may more than offset the increase in EOT of the oxygen-rich bottom oxynitride, for a net reduction in EOT of the charge trapping layer relative to conventional oxynitride charge trapping layers having a substantially homogeneous composition. In one such embodiment, the top oxynitride an effective dielectric constant of approximately 7.

Figure 7B:
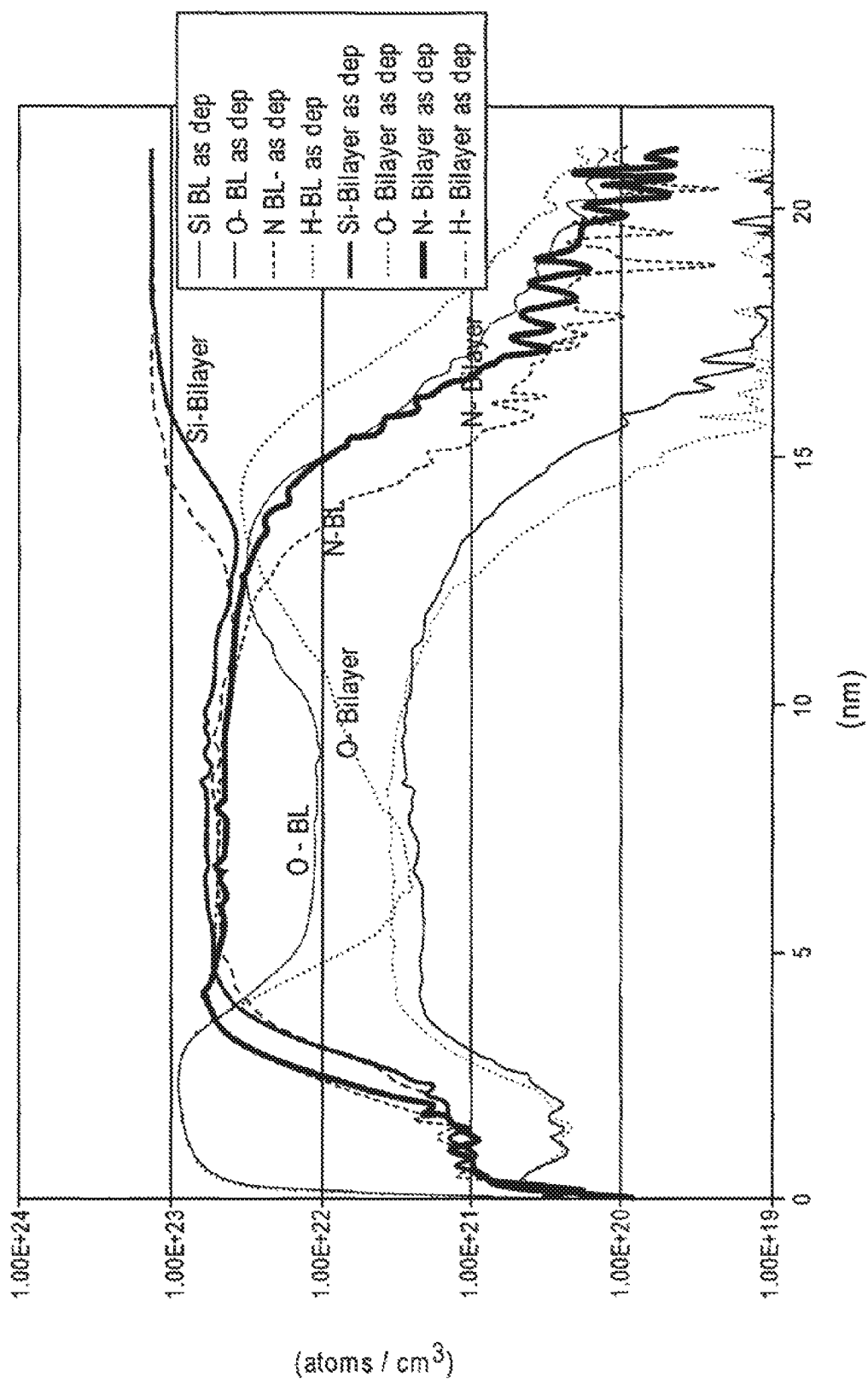
FIG. 7B illustrates a comparison of two concentration profiles of hydrogen, nitrogen, oxygen, and silicon in a blocking layer, charge trapping layer and tunneling layer of two different SONOS-type devices.

FIG. 7B depicts exemplary secondary ion mass spectroscopy (SIMS) profiles indicating the concentrations in atoms/cm3 of silicon (Si), nitrogen (N), oxygen (O) and hydrogen (H) after deposition (as-deposited) of a tunneling layer, charge trapping layer, and blocking layer. A base line condition ("BL") and a dual-layer oxynitride condition like that depicted in FIG. 5 ("Bilayer") are overlaid. The baseline condition has a conventional charge trapping layer with a homogenous composition. The x-axis represents the depth with 0 nm being at the exposed top surface of the blocking layer and proceeding through the stack from top down, terminating in the substrate. As shown, the oxygen concentration for the Bilayer condition is well below $1.0 \times 10^{22}$ atoms/cm$^3$ in the depth region between approximately 5 nm and 10 nm, corresponding to a portion of the charge trapping layer. In contrast, the baseline condition displays a substantially higher oxygen concentration of greater than $1.0 \times 10^{22}$ within this same region. As further shown, the baseline condition has a substantially constant oxygen concentration between the 6 nm and 10 nm marks while the Bilayer condition shows substantially more oxygen near the 10 nm mark than the 6 nm mark. This non-uniformity in oxygen concentration represents the transition between the oxygen lean top oxynitride and the oxygen-rich bottom oxynitride in the Bilayer condition.

In certain embodiments, the ratio of the bottom oxynitride layer thickness to the top oxynitride layer thickness is between 1:6 and 6:1, and more preferably at the ratio of bottom oxynitride thickness to top oxynitride thickness is at least 1:4. In an exemplary implementation where the first oxynitride has a physical thickness between 2.5 nm and 4.0 nm, the second oxynitride 518B has a physical thickness between 5.0 nm and 6.0 nm for a charge trapping layer 518 with a net physical thickness of between 7.5 nm and 10.0 nm. In one specific embodiment, employing a bottom oxynitride with a physical thickness of 30 Å, the top oxynitride has a physical thickness of 60 Å for a scaled charge trapping layer with a net physical thickness of 90 Å.

Figure 8A:
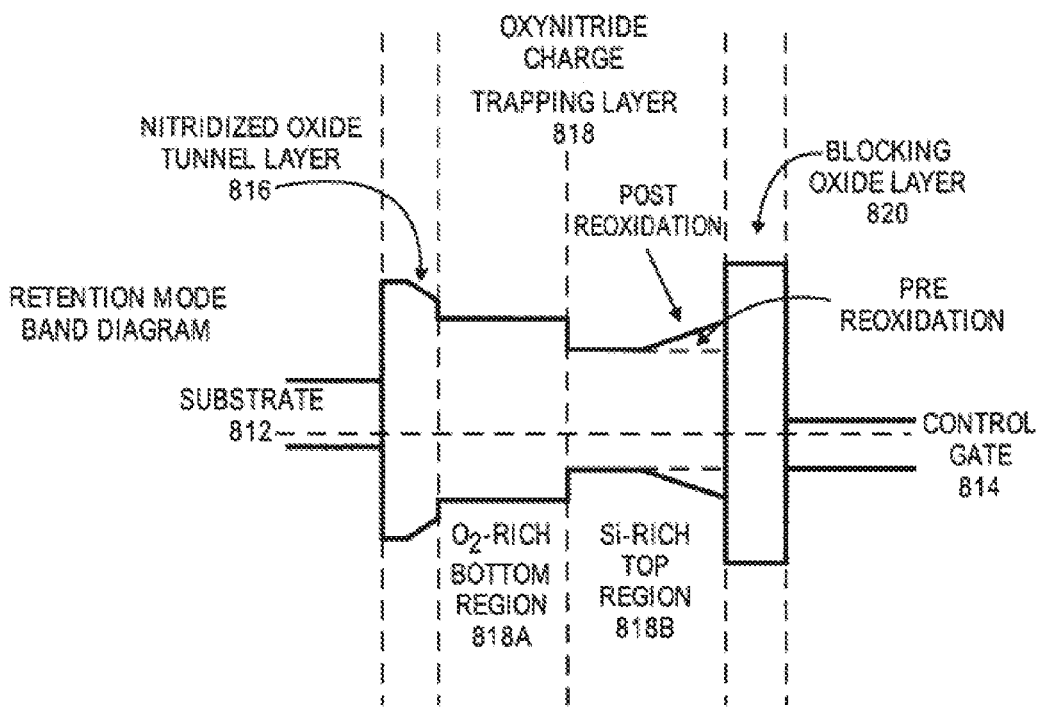
FIG. 8A depicts a retention mode energy band diagram of a scaled SONOS-type device in accordance with an embodiment of the present invention.
Figure 8B:
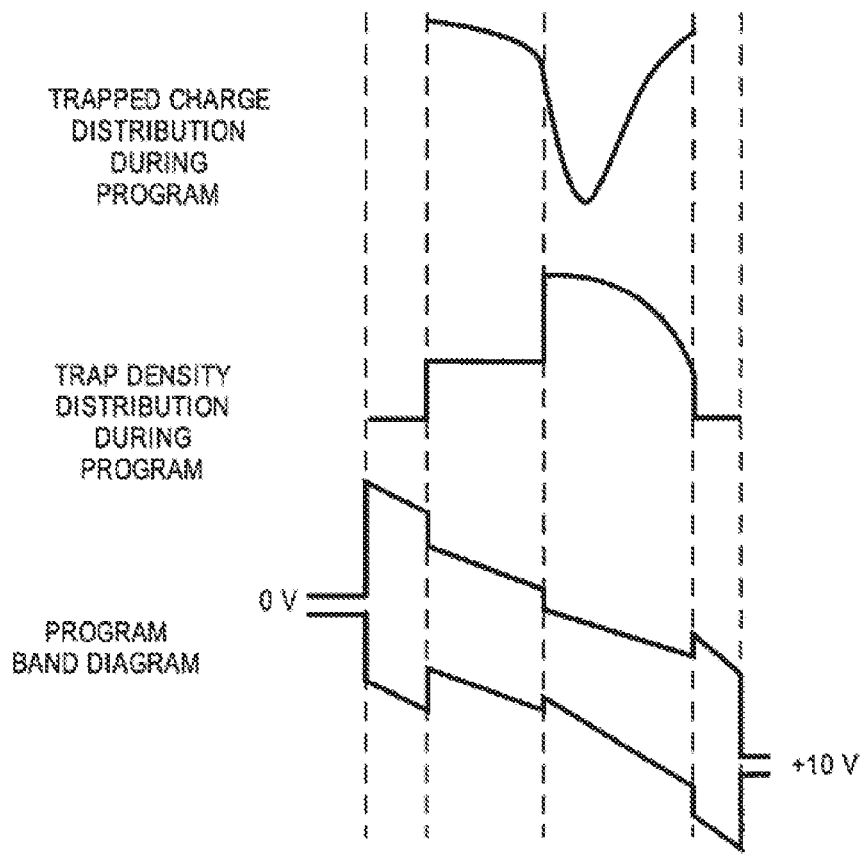
FIG. 8B depicts energy band diagram, trapped charge distribution and trap density distribution of a scaled SONOS-type device in accordance with an embodiment of the present invention during program.

In these particular embodiments, compositional non-homogeneity is utilized to both locate and confine traps to an embedded locale of the charge trapping layer (i.e. concentrate the traps) a distance from the tunnel layer interface. FIG. 8A further illustrates an energy band diagram during retention of a scaled SONOS device including a nitridized tunnel oxide 816, a multi-layer charge trapping oxynitride 818 and a densified blocking layer 820 between a substrate 812 and control gate 814 according to an embodiment of the present invention. As depicted, the non-homogeneity in the composition of the charge trapping layer 818 impacts both the valence and conduction bands between the silicon-rich top oxynitride 818B and oxygen-rich bottom oxynitride 818A of the charge trapping layer. As shown in FIG. 8B, the charge trapping layer in accordance with an embodiment the present invention provides a modulation in the bands at the interface of the oxygen-rich and silicon-rich oxynitride layers within the charge trapping layer 818. This band gap modulation serves to locate the trapped charge centroid within the top oxynitride layer, further away from the substrate for a given charge trapping layer thickness. The conduction band modulation between the oxynitride layers may also serve to reduce back streaming.

As further shown in FIG. 8A, a portion of the silicon-rich top oxynitride 818B is oxidized or reoxidized in a particular embodiment. Such an oxidation of the silicon rich top region may produce a graded band gap proximate to the blocking layer 820 relative to the pre-oxidation band gap depicted as dashed lines for illustration purposes in FIG. 8A. In an embodiment, approximately half of the top oxynitride layer 818B is reoxidized to have a higher oxygen concentration toward the interface with the blocking layer 820. In another embodiment, substantially all of the top oxynitride layer 818B is reoxidized to have a higher oxygen concentration than as-deposited. In one embodiment, the reoxidation increases the oxygen concentration in the top oxynitride layer 818B by approximately $0.25 \times 10^{21}$-$0.35 \times 10^{21}$ atoms/cm. Such embodiments employing a reoxidized charge trapping layer may prevent trap migration to the interface between the charge trapping layer and the blocking layer, thereby allowing the charge trapping layer thickness to be reduced without incurring the charge retention penalty associated with thinning a charge trapping layer of substantially homogeneous composition. Preventing the charge from migrating to the blocking oxide layer also reduces the electric field across the blocking oxide during erase which reduces the back streaming of electrons, or to allow scaling down the blocking oxide while maintaining the same level of electron back streaming. Such trap location and confinement provided by the regions of distinct stoichiometry in the charge trapping layer and as further combined with reoxidation of a portion of the charge trapping layer in particular embodiments may enable a scaled SONOS device in accordance with the present invention to operate at a reduced voltage or with faster program and erase times while maintaining good memory retention.

Although depicted in the figures and described elsewhere herein as having only two oxynitride layers, i.e., a top and a bottom layer, the present invention is not so limited, and the multi-layer charge storing layer can include any number, n, of oxynitride layers, any or all of which having differing compositions of oxygen, nitrogen and/or silicon. In particular, multi-layer charge storing layers having up to five oxynitride layers of differing compositions have been produced and tested.

As further depicted in FIG. 5, the blocking layer 520 of the ONO stack 504 includes a layer of silicon dioxide between about 30 Å and about 50 Å. Scaling of the blocking layer 520 in the ONO stack of the SONOS-type device is non-trivial because if done improperly can detrimentally increase back streaming of carriers from the control gate under certain bias conditions. In one embodiment including a partially reoxidized charge trapping layer, the blocking layer 520 is a high temperature oxide (HTO) which is relatively denser than as-deposited. A densified oxide has a lower fraction of terminal hydrogen or hydroxyl bonds. For example, removal of the hydrogen or water from an HTO has the effect of increasing the film density and improving the quality of the HTO. The higher quality oxide enables the layer to be scaled in thickness. In one embodiment, the hydrogen concentration is greater than $2.5 \times 10^{20}$ atoms/cm3 as deposited and is reduced to below $8.0 \times 10^{19}$ atoms/cm3 in the densified film. In an exemplary embodiment, the thickness of the HTO is between 2.5 nm and 10.0 nm as-deposited and anywhere between 10% and 30% thinner upon densification.

In an alternate embodiment, the blocking oxide layer is further modified to incorporate nitrogen. In one such embodiment, the nitrogen is incorporated in the form of an ONO stack across the thickness of the blocking oxide layer. Such a sandwich structure in place of the conventional pure oxygen blocking layer advantageously reduces the EOT of the entire stack between the channel and control gate as well as enable tuning of band offsets to reduce back injection of carriers. The ONO block layer can then be incorporated with the nitridized tunnel oxide and charge trapping layer comprising a bottom oxynitride layer and a top oxynitride layer.

Over the ONO stack 504 is a gate layer 514. The gate layer 514 may be any conductor or semiconductor material. In one such embodiment, the gate layer 514 is polysilicon (poly). In another embodiment, the gate layer 514 contains a metal, such as, but not limited to, hafnium, zirconium, titanium, tantalum, aluminum, ruthenium, palladium, platinum, cobalt and nickel, their silicides, their nitrides and their carbides. In one particular embodiment, the gate layer 514 is poly-silicon having a physical thickness of between 70 nm and 250 nm.

As further shown in FIG. 5, the SONOS-type device 500 includes a gate cap layer 525 super adjacent to the gate layer 514 and has approximately the same critical dimensions as the gate layer 514 and ONO stack 504. In certain embodiments, the gate cap layer 525 forms the top layer of the gate stack 502 and provides a hard mask during patterning of the gate layer 514 and ONO stack 504. In some embodiments, the gate cap layer 525 facilitates formation of self-aligned contacts (SAC) to the SONOS devices. The gate cap layer 525 may be comprised of any material capable providing the necessary selectivity to subsequent etch processes, such as, but not limited to, silicon dioxide, silicon nitride and silicon oxynitride.

In one specific embodiment, a SONOS-type device employs an ONO stack including a nitridized tunnel oxide with an EOT of 14 Å corresponding to a physical thickness of approximately 18 Å, a charge trapping layer comprising a bottom oxynitride layer with an EOT of 20 Å corresponding to a physical thickness of approximately 25 Å and a top oxynitride layer with an EOT of 30 Å corresponding to a physical thickness of approximately 60 Å, and a blocking oxide layer deposited to 40 Å and densified to 30 Å. Such a SONOS-type device may be operated at a voltage range of approximately 9 V, to provide an initial erase voltage threshold level (VTE) of −2 V after a 1 ms to 10 ms pulse.

Figure 9:
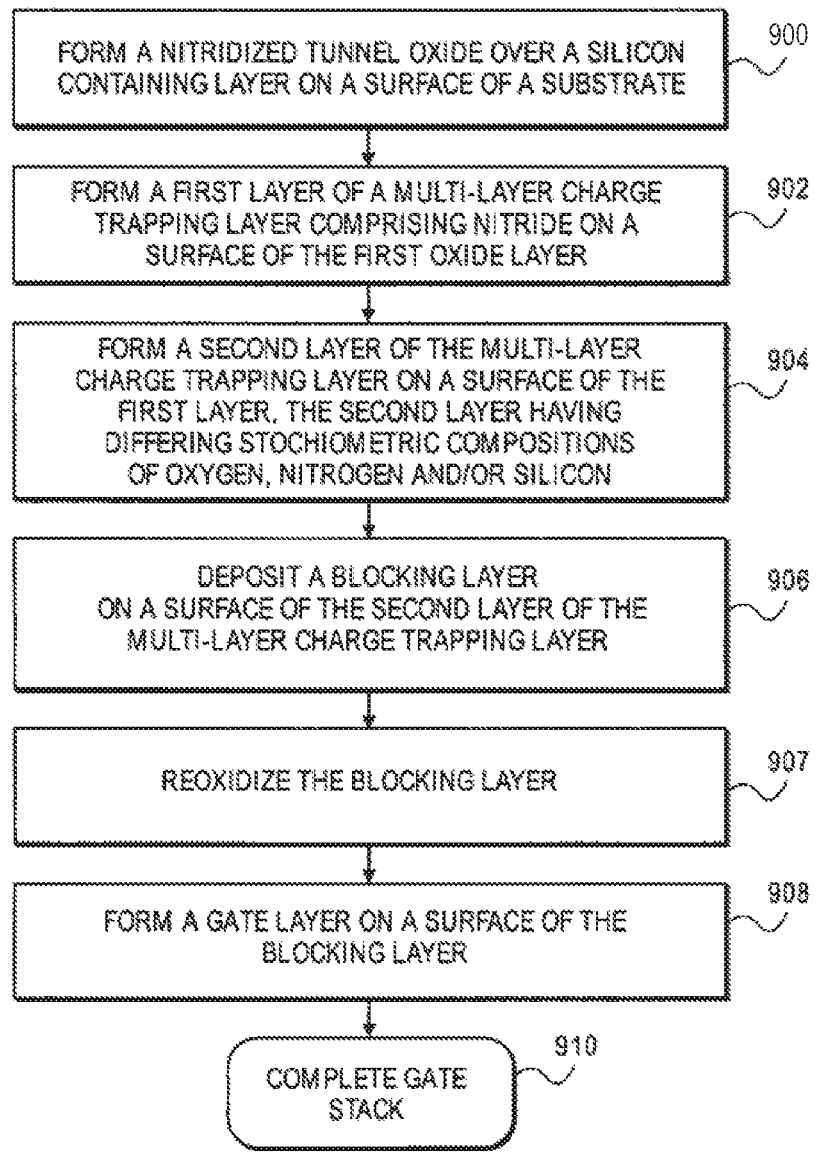
FIG. 9 is a flow chart of a SONOS scaling method of fabricating a scaled ONO structure including a nitridized oxide tunneling layer, a multi-layer charge trapping layer and a reoxidized blocking layer according to an embodiment of the present invention.
Figure 10:
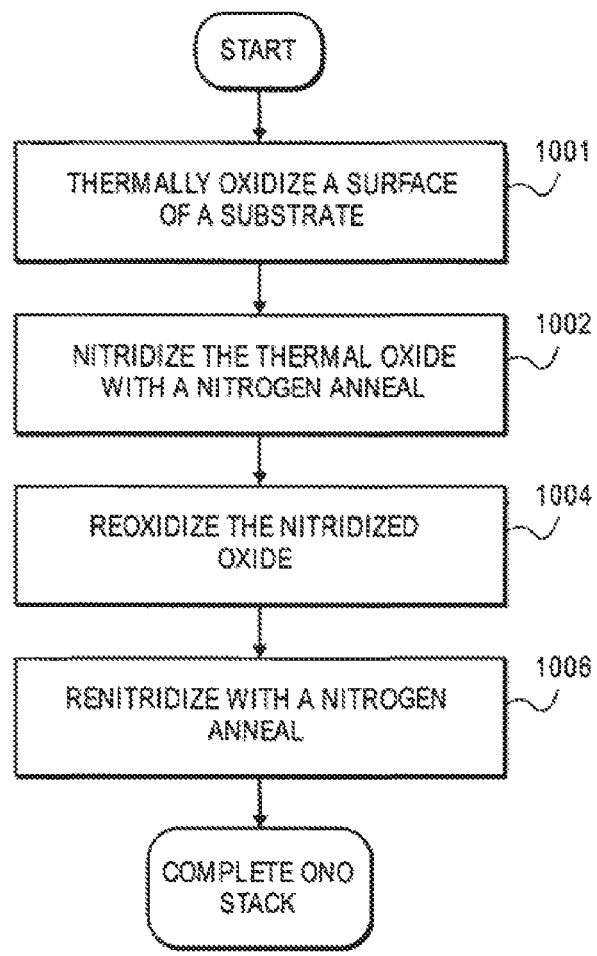
FIG. 10 is a flow chart of a SONOS scaling method of forming a nitridized oxide tunneling layer.

FIG. 9 depicts a flow chart of a method for fabricating a scaled SONOS, such as that depicted in FIG. 5, including a nitridized oxide tunneling layer, a multi-layer charge trapping oxynitride that has been partially reoxidized and a densified blocking oxide layer, as described above. The fabrication method of FIG. 9 begins with forming a nitridized oxide tunneling layer over a silicon-containing surface of a substrate at operation 900. FIG. 10 depicts a flow chart of specific method for forming the nitridized oxide of operation 900 in FIG. 9.

In the embodiment depicted in FIG. 10, tailoring of the nitrogen profile in the nitridized tunnel oxide of a SONOS-type device is accomplished with a multi-step nitridation and oxidation method. At operation 1001, a thin thermal oxide is formed from a silicon containing layer on a surface of a substrate, such as substrate 508 of FIG. 5. Because a good interface with the substrate is necessary, formation of a chemical oxide may preface the thermal oxidation. In a particular embodiment, therefore, a chemical oxide is present during the thermal oxidation (as opposed to performing a conventional "HF last" preclean). In one such embodiment, the chemical oxide is grown with ozonated water to form a chemical oxide layer with a thickness of approximately 1.0 nm.

The thermal oxide is formed to a thickness of between approximately 1.0 nm and 1.8 nm. In a particular embodiment, the thermal oxide is formed to a thickness of between 1.0 nm and 1.2 nm. Thus, in embodiments where a 1.0 nm chemical oxide is present during the thermal oxidation of operation 501, the thickness of the surface oxide does not substantially increase, however the quality of the oxide is improved. In a further embodiment, the oxide is of relatively low density to facilitate subsequent incorporation of a significant wt % of nitrogen. Too low of a film density, however, will result in too much nitrogen at the silicon substrate interface. Formation of the silicon dioxide layer at operation 1001 further serves as a means to block additional substrate oxide formation during subsequent thermal processing, discussed further below. In one embodiment, an atmospheric pressure vertical thermal reactor (VTR) is employed to grow the thermal oxide at a temperature between 680° C. and 800° C. in the presence of an oxidizing gas such as, oxygen ($O_2$), nitrous oxide ($N_2O$), nitric oxide (NO), ozone (O3), and steam ($H_2O$). Depending on the oxidizer chosen, the oxidation of operation 1001 may be from 3.5 minutes to 20 minutes in duration. In one atmospheric embodiment, employing $O_2$ gas at a temperature between 700° C. and 750° C., a process time between 7 minutes and 20 minutes forms an approximately 1.0 nm silicon dioxide film.

In another embodiment, the oxidation operation 1001 is performed with a sub-atmospheric processor such as the Advanced Vertical Processor (AVP) commercially available from AVIZA technology of Scotts Valley, Calif. The AVP may be operated in the temperature range described above for a VTR embodiment and at a pressure between 1 Torr (T) and atmospheric pressure. Depending on the operating pressure, the oxidation time to form a thermal silicon dioxide film of between approximately 1.0 nm and 1.8 nm in thickness may extend up to nearly an hour, as may be determined by one of ordinary skill in the art.

Next, at operation 1002 in the multiple oxidation nitridation method embodiment depicted in FIG. 10, the thermal oxide formed at operation 1001 is nitridized. Generally, at operation 1002, a nitrogen anneal is performed to increase the dielectric constant (K) and reduce the fixed charge of the thermal oxide layer. In one embodiment, the nitrogen anneal employs nitrogen ($N_2$) or a hydrogenated nitrogen source, such as ammonia ($NH_3$). In another embodiment, the nitrogen anneal employs a deuterated nitrogen source, such as deuterated ammonia ($ND_3$). In one specific embodiment, the nitrogen anneal is performed at a temperature between 700° C. and 850° C. for between 3.5 minutes and 30 minutes. In another specific embodiment, the nitrogen anneal is performed at a temperature between 725° C. and 775° C., for between 3.5 minutes and 30 minutes. In one such embodiment, $NH_3$ is introduced at atmospheric pressure at a temperature of between 725° C. and 775° C., for between 3.5 minutes and 30 minutes. In an alternative embodiment, a sub atmospheric $NH_3$ anneal is performed at 800° C. to 900° C. for 5 minutes to 30 minutes in a processor such as the AVP.

In still other embodiments, commonly known nitrogen plasma and thermal anneal combinations are performed.

Following operation 1002, a reoxidation is performed at operation 1004. In one embodiment, during the reoxidation process, an oxidizing gas is thermally cracked to provide oxygen radicals close to the film surface. The oxygen radicals eliminate nitrogen and hydrogen trap charge. The reoxidation operation 1004 also grows an additional oxide at the substrate interface to provide a physical offset between the substrate and a nitrogen concentration within the tunneling layer. For example, referring back to FIG. 5, the reoxidation helps to separate the substrate interface 513 from a nitrogen concentration within the tunneling layer 516. As specifically shown in FIG. 6, for one implementation, the nitrogen concentration 614 in the tunneling layer 616 at the substrate interface 613 is significantly below $5\times10^{21}$ atoms/cm$^3$ and may be on the order of $5\times10^{20}$ atoms/cm$^3$. This offset in the nitrogen from the substrate interface improves retention of a SONOS-type device. In one embodiment, the thickness of the oxide grown at the substrate interface 613 is limited to between 1.2 nm and 3.0 nm. At operation 1004, the reoxidation process conditions are chosen such that the thickness of the thermal oxide formed at operation 1001 prevents oxidation beyond a thickness of approximately 3.0 nm, which could render a tunneling layer devoid of any advantageous nitrogen concentration. Commonly known oxidizers may be employed for the reoxidation process, such as, but not limited to, NO, $N_2O$, $O_2$, $O_3$ and steam. Any such oxidizers may be introduced with known thermal processors operating at a temperature of between 800° C. and 850° C. Depending on the operating parameters, reoxidation time may be anywhere between 5 minutes and 40 minutes. In a particular embodiment, NO is employed in an atmospheric furnace operated at a temperature between 800° C. and 850° C. for a process time of approximately 15 minutes to form a nitridized oxide film that is approximately 2.2 nm in thickness on a silicon substrate. In one such embodiment, the reoxidized film 2.2 nm thick forms a region between 0.5 nm and 0.8 nm proximate to the interface with the silicon substrate, the region having a nitrogen concentration below $5\times10^{21}$ atoms/cm$^3$.

Following the reoxidation of operation 1004, a second nitrogen anneal is performed at operation 1006 to renitridize the tunneling layer. A second nitrogen anneal is employed to further increase the dielectric constant of the tunneling layer without detrimentally introducing a large number of hydrogen or nitrogen traps at the substrate interface. In one embodiment, the second nitrogen anneal of operation 1006 is performed with conditions identical to the anneal performed in operation 1002. In another embodiment, the second nitrogen anneal of operation 1006 is performed at a higher temperature than the first nitrogen anneal of operation 1002 to introduce additional nitrogen into the tunneling layer. In one embodiment, the nitrogen anneal employs a hydrogenated nitrogen source, such as $NH_3$ In another embodiment, the nitrogen anneal employs a deuterated nitrogen source, such as $ND_3$. In a specific embodiment, the nitrogen anneal of operation 1006 employs $NH_3$ at atmospheric pressure and a temperature between 750° C. and 950° C. with a processing time of between 3.5 minutes and 30 minutes. In another particular embodiment, the $NH_3$ anneal is performed at atmospheric pressure between 800° C. and 850° C. for between 5 minutes and 10 minutes.

As described, operations 1001 through 1006 depicted in FIG. 10 provide two oxidation operations and two nitridation operations. The iterative oxidation, nitridation scheme depicted enables specific tailoring of the nitrogen concentration in the tunneling layer to achieve both a reduction in programming voltage or increase in programming speed and an increase in memory retention of a SONOS-type device. The successive nature of the oxidation, nitridation, reoxidation, renitridation operations 1001-1006 enable an appreciable nitrogen concentration in a tunneling layer less than 3.0 nm thick while providing an interface between the tunneling layer and the substrate that has very little nitrogen and hydrogen traps. The independent oxidation, nitridation, reoxidation, renitridation operations 1001-1006 enable the first and second oxidations and first and second nitridation to be performed with independently engineered conditions to provide greater degrees of freedom in tailoring the nitrogen concentration profile in a tunneling layer. In one advantageous embodiment, operation 1001, 1002, 1004 and 1006 are successively performed in a single thermal processor without removing the substrate from the processor between operations. In one such embodiment, process pressure is held at atmosphere for operations 1001-1006. First, oxidation operation 1001 is performed at a temperature of between 700° C. and 750° C. Gas flows are then modified as prescribed to perform the nitrogen anneal of operation 1002 at a temperature between 725° C. and 775° C. The furnace temperature is then ramped up to between 800° C. and 850° C. and gas flows are again modified to perform the reoxidation of operation 1004. Finally, while holding the furnace between 800° C. and 850° C., gas flows are again modified to perform the second nitrogen anneal of operation 1006.

With the nitridized oxide tunneling layer 516 of FIG. 5 substantially complete, fabrication of the ONO stack may continue by returning to the method depicted in FIG. 9. In one embodiment, multiple nitride or oxynitride charge trapping layers are formed at operations 902 and 904 in a low pressure chemical vapor deposition (CVD) process using a silicon source, such as silane (SiH4), dichlorosilane (SiH2Cl4), tetrachlorosilane (SiCl4) or BisTertiaryButylAmino Silane (BTBAS), a nitrogen source, such as N2, NH3, N2O or nitrogen trioxide (NO3), and an oxygen-containing gas, such as O2 or N2O. Alternatively, gases in which hydrogen has been replaced by deuterium can be used, including, for example, the substitution of ND3 for NH3 The substitution of deuterium for hydrogen advantageously passivates Si dangling bonds at the substrate interface, thereby increasing an NBTI (Negative Bias Temperature Instability) lifetime of SONOS-type devices.

In one exemplary implementation, an oxynitride charge trapping layer can be deposited at operation 902 over a tunneling layer by placing the substrate in a deposition chamber and introducing a process gas including $N_2O$, $NH_3$ and DCS, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In a further embodiment, the process gas can include a first gas mixture of $N_2O$ and $NH_3$ mixed in a ratio of from about 8:1 to about 1:8 and a second gas mixture of $SiH_2Cl_2$ and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich oxygen-rich, oxynitride layer, such as the charge trapping layer 518A depicted in FIG. 5. Formation of the charge trapping layer may further involve a CVD process at operation 904 employing a first gas mixture of N2O and NH3 mixed in a ratio of from about 8:1 to about 1:8 and a second gas mixture of SiH$_2$Cl$_2$ and NH$_3$ mixed in a ratio of from about 1:7 to about 7:1, introduced at a flow rate of from about 5 to about 20 seem to yield a silicon-rich, nitrogen-rich, and oxygen lean oxynitride layer, such as the charge trapping layer 518B depicted in FIG. 5.

In one embodiment, formation of a charge trapping layer at operations 902 and 904 is performed sequentially in the same processing tool used to form the tunneling layer without unloading the substrate from the deposition chamber between operations 900 and 904. In a specific embodiment, the charge trapping layer is deposited without altering the temperature at which the substrate was heated during the second nitrogen anneal of operation 1006 of FIG. 10. In one embodiment, the charge trapping layer is deposited sequentially and immediately following nitridation of the tunneling layer at operation 900 by modifying the flow rate of NH$_3$ gas, and introducing N$_2$O and SiH$_2$Cl$_2$ to provide the desired gas ratios to yield either a silicon-rich and oxygen-rich layer, a silicon-rich and nitrogen-rich oxynitride layer, or both layers in a dual-layer implementation.

Following operation 904, a blocking layer can be formed at operation 906 by any suitable means including, for example, thermal oxidation or deposition with CVD techniques. In a preferred embodiment, the blocking layer is formed with a high-temperature CVD process. Generally, the deposition process involves providing a silicon source, such as SiH$_4$, SiH$_2$Cl, or SiCl$_4$ and an oxygen-containing gas, such as O$_2$ or N$_2$O in a deposition chamber at a pressure of from about 50 mT to about 1000 mT, for a period of from about 10 minutes to about 120 minutes while maintaining the substrate at a temperature of from about 650° C. to about 850° C. Preferably, the blocking layer is deposited sequentially in the same processing tool employed to form the charge trapping layer(s) at operations 902 and 904. More preferably, the blocking layer is formed in the same processing tool as is both the charge trapping layer(s) and the tunneling layer without removing the substrate between operations.

In the embodiment depicted in FIG. 9, the blocking layer deposited at operation 906 is reoxidized at operation 907 to densify the blocking layer oxide. As discussed elsewhere herein, operation 907 may further oxidize or reoxidize a portion or all of the charge trapping layer, such as a portion or all of the charge trapping layer 518B shown in FIG. 5 to achieve a graded band gap, such as depicted in FIG. 8A. Generally, the reoxidation may be performed in the presence of an oxidizing gas such as, oxygen (O$_2$), nitrous oxide (N$_2$O), nitric oxide (NO), ozone (O$_3$), and steam (H$_2$O). In one embodiment, the reoxidation process may is performed at a higher temperature than the temperature at which the blocking layer is deposited. Reoxidation after the deposition of the blocking oxide enables a more controlled diffusion of oxidizer to controllably oxidize or reoxidize the thin charge trapping layer. In a particularly advantageous embodiment, a dilute wet oxidation is employed. The dilute wet oxidation is distinct from a wet oxidation in that the H$_2$:O$_2$ ratio is between 1 and 1.3. In one specific embodiment, a dilute oxidation with an H$_2$:O$_2$ ratio of approximately 1.2 is performed at a temperature of between 800° C. and 900° C. In a further embodiment, the duration of the dilute oxidation may be sufficient to grow between 5.0 nm and 12.5 nm of silicon dioxide on a silicon substrate. In one such embodiment, the duration is sufficient to for an approximately 10 nm to 1.1 nm silicon dioxide layer on a silicon substrate. Such a dilute oxidation process serves to reoxidize the deposited blocking layer oxide and may further oxidize or reoxidize a portion of the charge trapping layer to impart a band structure like that depicted in FIG. 8A or 8B. In another embodiment, the reoxidation of operation 907 may further serve to form a gate oxide in a non-SONOS-type device region, such as for a complementary metal oxide silicon (CMOS) field effect transistors (FET), on the same substrate as the SONOS-type device. In another embodiment, the reoxidation of operation 907 may further serve to diffuse deuterium into portions of the charge trapping layer or blocking layer of the SONOS-type device.

As depicted in FIG. 9, the method may then be completed at operation 908 with formation of a gate layer, such as the gate layer 514 of FIG. 5. In certain embodiments, operation 908 may further include formation of a gate cap layer, such as gate cap layer 525 depicted in FIG. 5. With the completion of the gate stack fabrication, further processing may occur as known in the art to conclude fabrication of the SONOS-type device 300.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

Implementations and Alternatives

FIG. 11 illustrates a cross-sectional side view of an intermediate structure of a SONOS-type memory device 1100 having a scaled ONO structure including a nitridized oxide tunneling layer, a multi-layer charge trapping layer and a densified blocking layer. It should be appreciated that various other SONOS embodiments disclosed herein may also be employed to produce a scaled ONO stack beyond the specific embodiment depicted in FIG. 11, but nonetheless also operable at a reduced program/erase voltage. Thus, while the features of FIG. 11 may be referenced throughout the description, the present invention is not limited to this particular embodiment.

In the specific embodiment shown in FIG. 11, the SONOS-type memory device 1100 includes a SONOS gate stack 1102 including an ONO stack 1104 formed over a surface 1106 of a substrate 1108. SONOS-type memory device 1100 further includes one or more source and drain regions 1110, aligned to the gate stack 1102 and electrically connected by a channel region 1112. Generally, the scaled SONOS gate stack 1102 further includes a gate layer 1114 formed upon and in contact with the scaled ONO stack 1104 and a gate cap layer 1125 over the gate layer 1114. The gate layer 1114 is separated or electrically isolated from the substrate 1108 by the scaled ONO stack 1104.

In one embodiment, substrate 1108 is a bulk substrate comprised of a single crystal of a material which may include, but is not limited to, silicon, germanium, silicon-germanium or a III-V compound semiconductor material. In another embodiment, substrate 1108 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In another embodiment, substrate 1108 is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxy-nitride. The lower bulk layer is comprised of a single crystal which may include, but is not limited to, silicon, germanium, silicon/germanium, a III-V compound semiconductor material and quartz. Substrate 1108 and, hence, the channel region 1112 between the source and drain regions 1110, may comprise dopant impurity atoms. The channel region 1112 can comprise polysilicon or recrystallized polysilicon to form a monocrystalline channel region. In a specific embodiment, where the channel region 1112 includes a monocrystalline silicon, the channel region can be formed to have <100> surface crystalline orientation relative to a long axis of the channel region.

Source and drain regions 1110 in substrate 1108 may be any regions having opposite conductivity to the channel region 1112. For example, in accordance with an embodiment of the present invention, source and drain regions 1110 are N-type doped while channel region 1112 is P-type doped. In one embodiment, substrate 1108 is comprised of boron-doped single-crystal silicon having a boron concentration in the range of $1 \times 10^{15}$-$1 \times 10^{19}$ atoms/cm$^3$. Source and drain regions 1110 are comprised of phosphorous or arsenic doped regions having a concentration of N-type dopants in the range of $5 \times 10^{16}$-$5 \times 10^{19}$ atoms/cm$^3$. In a specific embodiment, source and drain regions 1110 have a depth in substrate 1108 in the range of 80-200 nanometers. In accordance with an alternative embodiment of the present invention, source and drain regions 1110 are P-type doped while the channel region of substrate 1108 is N-type doped.

The ONO stack 1104 includes a tunneling layer 1116, a multi-layer charge trapping layer 1118 and a blocking layer 1120.

In one embodiment, the tunneling layer 1116 is a nitridized oxide tunneling layer including a nitridized oxide. Because programming and erase voltages produce large electric fields across a tunneling layer, on the order of 10 MV/cm, the program/erase tunneling current is more a function of the tunneling layer barrier height than the tunneling layer thickness. However, during retention, there is no large electric field present and so the loss of charge is more a function of the tunneling layer thickness than barrier height. Nitridation increases the relative permittivity or dielectric constant ($\varepsilon$) of the tunneling layer improving tunneling current for reduced operating voltages. In particular embodiments, nitridation provides a tunneling layer 1116 with an effective between 4.75 and 5.25, and preferably between 4.90 and 5.1 (at standard temperature). In one such embodiment, nitridation provides a tunneling layer with an effective c of 5.07, at standard temperature.

In such embodiments, the multi-layer charge trapping layer 1118 charges faster during program/erase than a pure oxide tunneling layer of that thickness because relatively less of the large electric field from the control gate is dropped across the nitridized oxide tunneling layer (due to the relatively higher permittivity of nitridized tunnel oxide). These embodiments allow the SONOS-type memory device 1100 to operate with a reduced program/erase voltage while still achieving the same program/erase voltage threshold level (VTPNTE) as a conventional SONOS-type device.

In some embodiments, the nitridized oxide tunneling layer has the same physical thickness as a conventional, SONOS device employing pure oxide tunneling layer to improve tunneling current for reduced operating voltages without sacrificing charge retention. In certain embodiments, the SONOS-type memory device 1100 employs a nitridized oxide tunneling layer 1116 having a thickness of between 1.5 nm and 3.0 nm, and more preferably between 1.9 nm and 2.2 nm. In a particular embodiment, shown in FIG. 11B, the nitridized oxide tunneling layer 1116 includes a first region 1116A proximate to the channel region 1112 having a nitrogen concentration less than about $5 \times 10^{21}$ nitrogen atoms/cm$^3$, and a second region 1116B proximate to the multi-layer charge trapping layer 1118 having a nitrogen concentration at least $5 \times 10^{21}$ nitrogen atoms/cm$^3$. In one embodiment shown in FIG. 11B, the first and second regions of the nitridized oxide tunneling layer 1116 each comprise no more than approximately 25% of the tunneling layer thickness.

In a further embodiment, the multi-layer charge trapping layer 1118 includes at least two layers having differing compositions of silicon, oxygen and nitrogen. In one embodiment, the multi-layer charge-trapping region includes an oxygen-rich first layer 1118A comprising a substantially trap-free, silicon-rich, oxygen-rich nitride and an oxygen-lean second layer 1118B comprising a trap-dense, silicon-rich, nitrogen-rich, and oxygen-lean nitride. It has been found that the oxygen-rich first layer 1118A decreases the charge loss rate after programming and after erase, which is manifested in a small voltage shift in the retention mode. The oxygen-lean second layer 1118B improves the speed and increases of the initial difference between program and erase voltage without compromising a charge loss rate of memory devices made using an embodiment of the silicon-oxide-oxynitride-oxide-silicon structure, thereby extending the operating life of the device.

In another embodiment the multi-layer charge trapping layer 1118 is a split multi-layer charge trapping layer further including an intermediate oxide or anti-tunneling layer 1118C comprising an oxide separating the oxygen-rich first layer 1118A from the oxygen-lean second layer 1118B. During an erase of the SONOS-type memory device 1100 holes migrate toward the blocking layer 1120, but the majority of trapped hole charges form in the oxygen-lean second layer 1118B. Electron charge accumulates at the boundaries of the oxygen-lean second layer 1118B after programming, and thus there is less accumulation of charge at the lower boundary of the oxygen-rich first layer 1118A. Furthermore, due to the anti-tunneling layer 1118C, the probability of tunneling by trapped electron charges in the oxygen-lean second layer 1118B is substantially reduced. This may result in lower leakage current than for the conventional memory devices.

Although shown and described above as having two nitride layers, i.e., a first and a second layer, the present invention is not so limited, and the multi-layer charge trapping layer 1118 may include a number, n, of oxide, nitride or oxynitride layers, any or all of which may have differing stoichiometric compositions of oxygen, nitrogen and/or silicon. In particular, multi-layer charge storing structures having up to five, and possibly more, nitride layers each with differing stoichiometric compositions are contemplated. At least some of these layers will be separated from the others by one or more relatively thin oxide layers. However, as will be appreciated by those skilled in the art it is generally desirable to utilize as few layers as possible to accomplish a desired result, reducing the process steps necessary to produce the device, and thereby providing a simpler and more robust manufacturing process. Moreover, utilizing as few layers as possible also results in higher yields as it is simpler to control the stoichiometric composition and dimensions of the fewer layers.

In another embodiment, the blocking layer 1120 comprises a high temperature oxide (HTO) which is relatively denser than as-deposited. A densified HTO has a lower fraction of terminal hydrogen or hydroxyl bonds. For example, removal of the hydrogen or water from an HTO has the effect of increasing the film density and improving the quality of the HTO. The higher quality oxide enables the layer to be scaled in thickness. In one embodiment, the hydrogen concentration is greater than 2.5×1020 atoms/cm3 as deposited and is reduced to below 8.0×1019 atoms/cm3 in the densified film. In an exemplary embodiment, the thickness of the blocking layer 1120 comprising a densified HTO is between 2.5 nm and 10.0 nm as-deposited and anywhere between 10% and 30% thinner upon densification.

In an alternate embodiment, the blocking layer 1120 is further modified to incorporate nitrogen. In one such embodiment, the nitrogen is incorporated in the form of an ONO stack across the thickness of the blocking layer 1120. Such a sandwich structure in place of the conventional pure oxygen blocking layer advantageously reduces the EOT of the entire stack between the channel region 1112 and control gate 1114 as well as enable tuning of band offsets to reduce back injection of carriers. The ONO stack blocking layer 1120 can then be incorporated with the nitridized oxide tunneling layer 1116 and split multi-layer charge trapping layer 1118 comprising an oxygen-rich first layer 1118A, an oxygen-lean second layer 1118B and an anti-tunneling layer 1118C.

A method or forming or fabricating a memory device including a nitridized oxide tunneling layer, a split multi-layer charge trapping layer and a densified blocking layer according to one embodiment will now be described with reference to the flowchart of FIG. 12.

Figure 12:
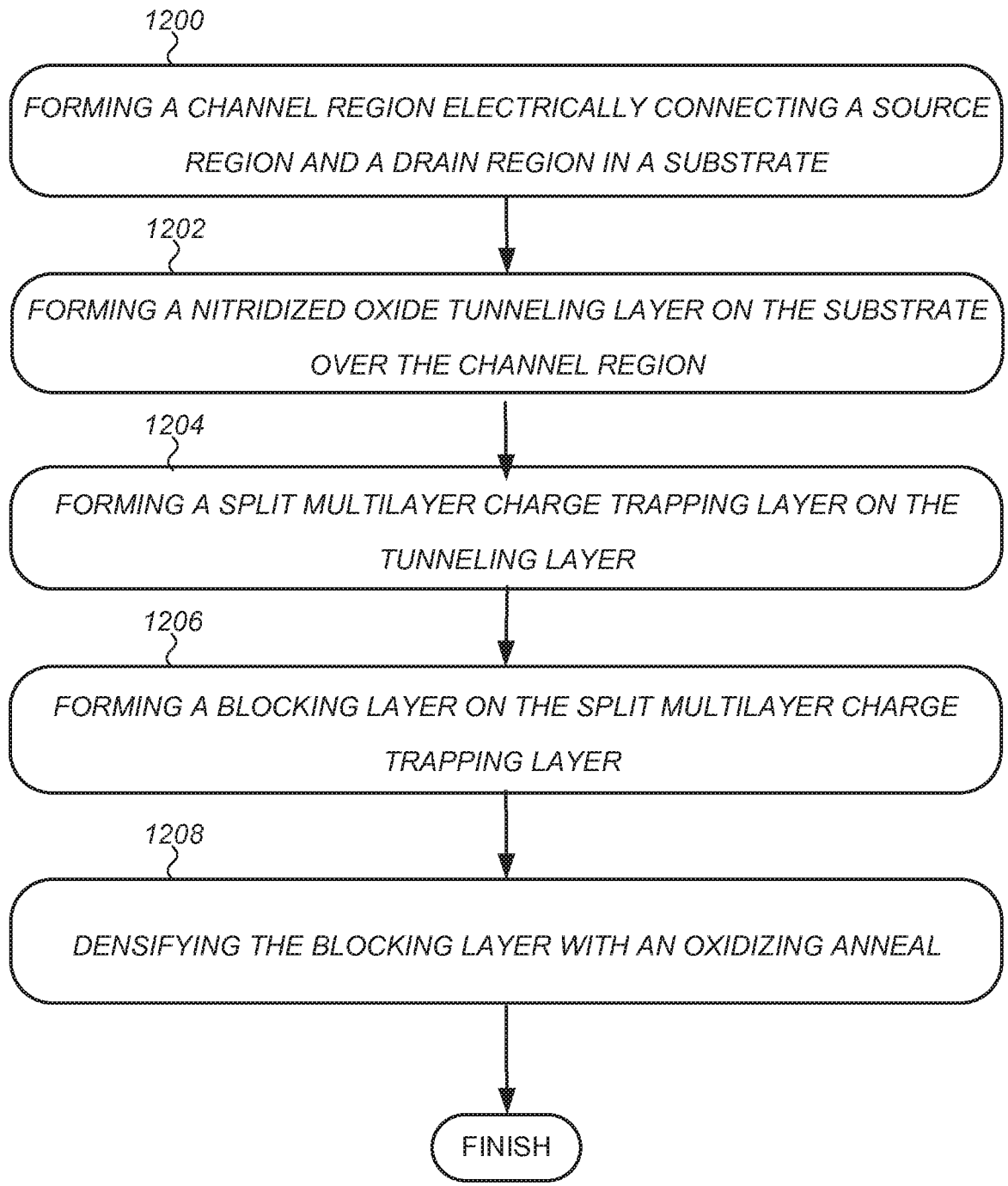
FIG. 12 is a flow chart of a method of forming a scaled nonvolatile trapped-charge memory device having a scaled ONO structure including a nitridized oxide tunneling layer, a split multi-layer charge trapping layer and a densified blocking layer according to an embodiment of the present invention.

Referring to FIG. 12, the method begins at operation 1200 with forming a channel region comprising polysilicon in or on a surface of a substrate, the channel region electrically connecting a source region and a drain region in the substrate. As noted above, the channel region may comprise P-type or N-type dopant impurity atoms. In a specific embodiment, the channel region is doped and, in an alternative embodiment, the channel region is doped. The source and drain regions may be doped with opposite type dopant impurity atoms to the channel region. For example, in accordance with one specific embodiment, the source and drain regions are N-type doped with phosphorous or arsenic doped regions having a concentration in the range of $5 \times 10^{16}$-$5 \times 10^{19}$ atoms/cm$^3$, while the channel region is P-type doped with boron having a concentration in the range of $1 \times 10^{15}$-$1 \times 10^{19}$ atoms/cm$^3$.

At operation 1202, a tunneling layer comprising a nitridized oxide is formed on the substrate over the channel region. Generally, the tunneling layer comprising a nitridized oxide is formed by thermally oxidizing the substrate to form an oxide film followed by nitridizing the oxide film. Because a good interface with the substrate is necessary, formation of the thermal oxidation may be preceded by formation of a chemical oxide. In a particular embodiment, a chemical oxide is grown with ozonated water to form a chemical oxide layer with a thickness of approximately 1.0 nm. The thermal oxide is then formed to a thickness of between approximately 1.0 nm and 1.8 nm. Preferably, the oxide is of relatively low density to facilitate subsequent incorporation of a significant wt % of nitrogen. Too low of a film density, however, will result in too much nitrogen at the silicon substrate interface. In one embodiment, an atmospheric pressure vertical thermal reactor (VTR) is employed to grow the thermal oxide at a temperature between 680° C. and 800° C. in the presence of an oxidizing gas such as, oxygen ($O_2$), nitrous oxide ($N_2O$), nitric oxide (NO), ozone ($O_3$), and steam ($H_2O$). Depending on the oxidizer chosen, the oxidation of operation 1001 may be from 3.5 minutes to 20 minutes in duration. In one atmospheric embodiment, employing $O_2$ gas at a temperature between 700° C. and 750° C., a process time between 7 minutes and 20 minutes forms an approximately 1.0 nm silicon dioxide film.

In another embodiment, the thermal oxide is formed with a sub-atmospheric processor such as the Advanced Vertical Processor (AVP) commercially available from AVIZA technology of Scotts Valley, Calif. The AVP may be operated in the temperature range described above for a VTR embodiment and at a pressure between 1 Torr (T) and atmospheric pressure. Depending on the operating pressure, the oxidation time to form a thermal silicon dioxide film of between approximately 1.0 nm and 1.8 nm in thickness may extend up to nearly an hour, as may be determined by one of ordinary skill in the art.

Next, a nitrogen anneal is performed to nitridize the thermal to increase the dielectric constant (K) and reduce the fixed charge of the thermal oxide layer. In one embodiment, the nitrogen anneal employs nitrogen ($N_2$) or a hydrogenated nitrogen source, such as ammonia ($NH_3$). In another embodiment, the nitrogen anneal employs a deuterated nitrogen source, such as deuterated ammonia ($ND_3$). In one specific embodiment, the nitrogen anneal is performed at a temperature between 700° C. and 850° C. for between 3.5 minutes and 30 minutes. In another specific embodiment, the nitrogen anneal is performed at a temperature between 725° C. and 775° C., for between 3.5 minutes and 30 minutes. In one such embodiment, $NH_3$ is introduced at atmospheric pressure at a temperature of between 725° C. and 775° C., for between 3.5 minutes and 30 minutes. In an alternative embodiment, a sub atmospheric $NH_3$ anneal is performed at 800° C. to 900° C. for 5 minutes to 30 minutes in a processor such as the AVP. In still other embodiments, commonly known nitrogen plasma and thermal anneal combinations are performed.

Optionally, forming the nitridized oxide tunneling layer further includes reoxidizing the oxide film by exposing the substrate to $O_2$, and renitridizing the reoxidized nitridized oxide film by exposing the substrate the nitridized oxide film to NO. In one embodiment, during the reoxidation process, an oxidizing gas is thermally cracked to provide oxygen radicals close to the film surface. The oxygen radicals eliminate nitrogen and hydrogen trap charge. The reoxidation process also grows an additional oxide at an interface between the substrate and the tunneling layer to provide a physical offset between the substrate and a nitrogen concentration within the tunneling layer. For example, referring back to FIGS. 11A and 11B, in one embodiment the nitrogen concentration in the tunneling layer 1116A is significantly below that of in the tunneling layer 1116B. This offset in the nitrogen from the substrate interface improves retention of a SONOS-type device. In one embodiment, the thickness of the oxide grown at the substrate interface is limited to between 1.2 nm and 3.0 nm. In the reoxidation process conditions are chosen such that the thickness of the thermal oxide formed at operation 1001 prevents oxidation beyond a thickness of approximately 3.0 nm, which could render a tunneling layer devoid of any advantageous nitrogen concentration. Commonly known oxidizers may be employed for the reoxidation process, such as, but not limited to, NO, $N_2O$, $O_2$, $O_3$ and steam. Any such oxidizers may be introduced with known thermal processors operating at a temperature of between 800° C. and 850° C. Depending on the operating parameters, reoxidation time may be anywhere between 5 minutes and 40 minutes. In a particular embodiment, NO is employed in an atmospheric furnace operated at a temperature between 800° C. and 850° C. for a process time of approximately 15 minutes to form a nitridized oxide film that is approximately 2.2 nm in thickness on a silicon substrate. In one such embodiment, the reoxidized film 2.2 nm thick forms a region between 0.5 nm and 0.8 nm proximate to the interface with the silicon substrate, the region having a nitrogen concentration below $5 \times 10^{21}$ atoms/cm$^3$.

Following the reoxidation operation, a second nitrogen anneal is performed to renitridize the tunneling layer. A second nitrogen anneal is employed to further increase the dielectric constant of the tunneling layer without detrimentally introducing a large number of hydrogen or nitrogen traps at the substrate interface. In one embodiment, the second nitrogen anneal of is performed with conditions identical to the initial or first nitrogen anneal. In another embodiment, the second nitrogen anneal of the renitridization operation is performed at a higher temperature than the first nitrogen anneal to introduce additional nitrogen into the tunneling layer. In one embodiment, the nitrogen anneal employs a hydrogenated nitrogen source, such as $NH_3$. In another embodiment, the nitrogen anneal employs a deuterated nitrogen source, such as $ND_3$. In a specific embodiment, the second nitrogen anneal employs $NH_3$ at atmospheric pressure and a temperature between 750° C. and 950° C. with a processing time of between 3.5 minutes and 30 minutes. In another particular embodiment, the $NH_3$ anneal is performed at atmospheric pressure between 800° C. and 850° C. for between 5 minutes and 10 minutes.

As described, operation 1202 and the reoxidization and renitridization provide two oxidation operations and two nitridation operations. The iterative oxidation, nitridation scheme depicted enables specific tailoring of the nitrogen concentration in the tunneling layer to achieve both a reduction in programming voltage or increase in programming speed and an increase in memory retention of a SONOS-type memory device. The successive nature of the oxidation, nitridation, reoxidation, renitridation operations enable an appreciable nitrogen concentration in a tunneling layer less than 3.0 nm thick while providing an interface between the tunneling layer and the substrate that has very little nitrogen and hydrogen traps. The independent oxidation, nitridation, reoxidation, renitridation operations enable the first and second oxidations and first and second nitridation to be performed with independently engineered conditions to provide greater degrees of freedom in tailoring the nitrogen concentration profile in a tunneling layer. In one advantageous embodiment, operations are successively performed in a single thermal processor without removing the substrate from the processor between operations. In one such embodiment, process pressure is held at atmosphere. The first oxidation operation is performed at a temperature of between 700° C. and 750° C. Gas flows are then modified as prescribed to perform the nitrogen anneal of operation at a temperature between 725° C. and 775° C. The furnace temperature is then ramped up to between 800° C. and 850° C. and gas flows are again modified to perform the reoxidation operation. Finally, while holding the furnace between 800° C. and 850° C., gas flows are again modified to perform the second nitrogen anneal operation.

In operation 1204 a multi-layer charge trapping layer is formed on the nitridized oxide tunneling layer. Generally, the multi-layer charge trapping layer includes a substantially trap free, oxygen-rich first layer, and a trap dense oxygen-lean second layer. In certain embodiments, the multi-layer charge trapping layer is a split multi-layer charge trapping layer further including an anti-tunneling layer comprising an oxide separating the first layer from the second layer.

In a particular embodiment, the oxygen-rich first layer is formed or deposited in a low pressure CVD process using a silicon source, such as silane ($SiH_4$), chlorosilane ($SiH_3Cl$), dichlorosilane or DCS ($SiH_2Cl_2$), tetrachlorosilane ($SiCl_4$) or Bis-TertiaryButylAmino Silane (BTBAS), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. For example, the oxygen-rich first layer can be deposited over the first deuterated layer by placing the substrate in a deposition chamber and introducing a process gas including $N_2O$, $NH_3$ and DCS, while maintaining the chamber at a pressure of from about 5 milliTorr (mT) to about 500 mT, and maintaining the substrate at a temperature of from about 700° C. to about 850° C. and in certain embodiments at least about 760° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, oxygen-rich first layer.

Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

An anti-tunneling layer is then formed or deposited on a surface of the oxygen-rich first layer. The anti-tunneling layer can be formed or deposited by any suitable means, including a plasma oxidation process, In-Situ Steam Generation (ISSG) or a radical oxidation process. In one embodiment, the radical oxidation process involves flowing hydrogen ($H_2$) and oxygen ($O_2$) gas into a batch-processing tool or furnace to effect growth of the anti-tunneling layer by oxidation consumption of a portion of the oxygen-rich first layer.

The oxygen-lean second layer of the multi-layer charge-trapping region is then formed on a surface of the anti-tunneling layer. The oxygen-lean second layer can be deposited over the anti-tunneling layer in a CVD process using a process gas including $N_2O$, $NH_3$ and DCS, at a chamber pressure of from about 5 mT to about 500 mT, and at a substrate temperature of from about 700° C. to about 850° C. and in certain embodiments at least about 760° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 20 sccm. It has been found that an oxynitride layer produced or deposited under these condition yields a silicon-rich, nitrogen-rich, and oxygen-lean second layer.

In some embodiments, the oxygen-lean second layer can be deposited over the anti-tunneling layer in a CVD process using a process gas including BTBAS and ammonia ($NH_3$) mixed at a ratio of from about 7:1 to about 1:7 to further include a concentration of carbon selected to increase the number of traps therein. The selected concentration of carbon in the second oxynitride layer can include a carbon concentration of from about 5% to about 15%.

Next, in operation 1206 a blocking layer is formed on the multi-layer charge trapping layer or the split multi-layer charge trapping layer. The blocking layer can be formed by any suitable means including, for example, thermal oxidation or deposition with CVD techniques. In a preferred embodiment, the blocking layer is formed with a high-temperature CVD process. Generally, the deposition process involves providing a silicon source, such as $SiH_4$, $SiH_2Cl$, or $SiCl_4$ and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C. Preferably, the blocking layer is deposited sequentially in the same processing tool employed to form the multi-layer charge trapping layer. More preferably, the blocking layer is formed in the same processing tool as both the multi-layer charge trapping layer and the tunneling layer without removing the substrate between operations.

In the embodiment depicted in FIG. 12, the blocking layer deposited at operation 1206 is reoxidized at operation 1208 to densify the blocking layer oxide. As discussed elsewhere herein, operation 1208 may further oxidize or reoxidize a portion of the second region 1116B of the multi-layer charge trapping layer 1116 to achieve a graded band gap, such as depicted in FIG. 8A. Generally, the reoxidation may be performed in the presence of an oxidizing gas such as, oxygen ($O_2$), nitrous oxide ($N_2O$), nitric oxide (NO), ozone ($O_3$), and steam ($H_2O$). In one embodiment, the reoxidation process may is performed at a higher temperature than the temperature at which the blocking layer is deposited. Reoxidation after the deposition of the blocking oxide enables a more controlled diffusion of oxidizer to controllably oxidize or reoxidize a portion of the second region 1116B. In a particularly advantageous embodiment, a dilute wet oxidation is employed. The dilute wet oxidation is distinct from a wet oxidation in that the $H_2:O_2$ ratio is between 1 and 1.3. In one specific embodiment, a dilute oxidation with an $H_2:O_2$ ratio of approximately 1.2 is performed at a temperature of between 800° C. and 900° C.

In a further embodiment, the duration of the dilute oxidation may be sufficient to grow between 5.0 nm and 12.5 nm of silicon dioxide on a silicon substrate. In one such embodiment, the duration is sufficient to for an approximately 10 nm to 1.1 nm silicon dioxide layer on a silicon substrate. Such a dilute oxidation process serves to reoxidize the deposited blocking layer oxide and may further oxidize or reoxidize a portion of the charge trapping layer to impart a band structure like that depicted in FIG. 8A or 8B.

In another embodiment, the reoxidation of operation 1208 may further serve to form a gate oxide in a non-SONOS-type device region, such as for a complementary metal oxide silicon (CMOS) field effect transistors (FET), on the same substrate as the SONOS-type device. In another embodiment, the reoxidation of operation 1208 may further serve to diffuse deuterium into portions of the multi-layer charge trapping layer or blocking layer of the SONOS-type device.

Figure 11A:
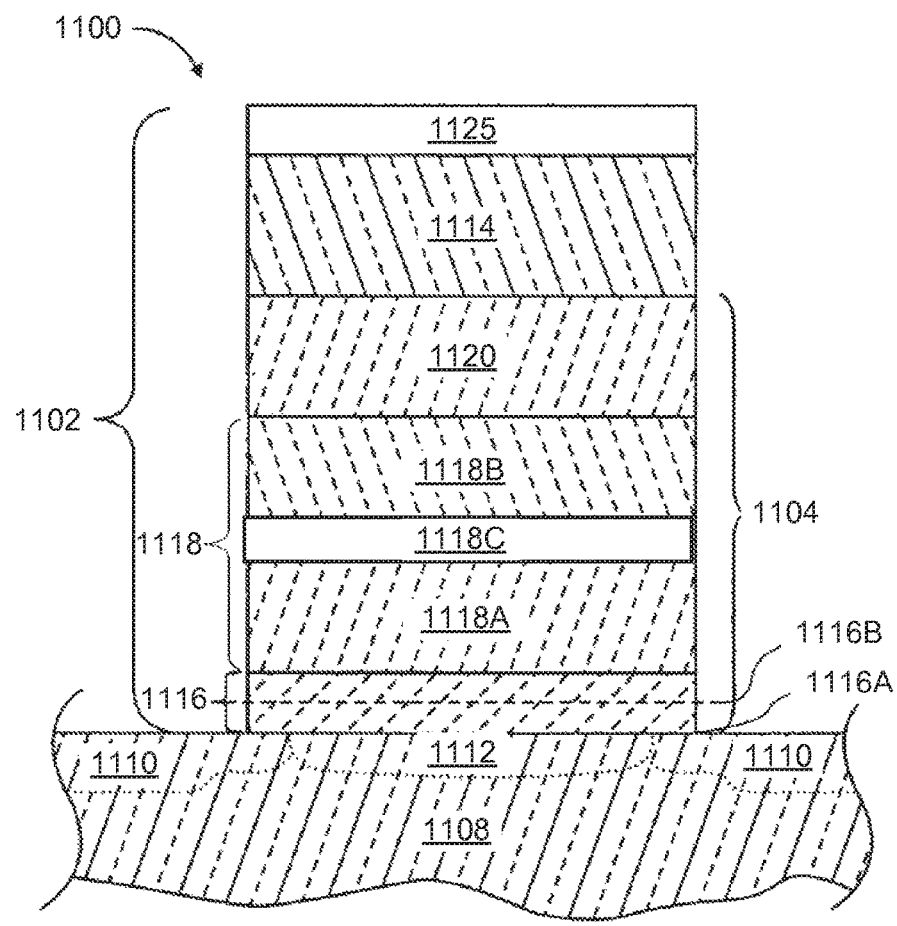
FIGS. 11A and 11B illustrates a cross-sectional side view of a portion of a scaled nonvolatile trapped-charge memory device having a scaled ONO structure including a nitridized oxide tunneling layer, a multi-layer charge trapping layer and a densified blocking layer according to an embodiment of the present invention.
Figure 11B:
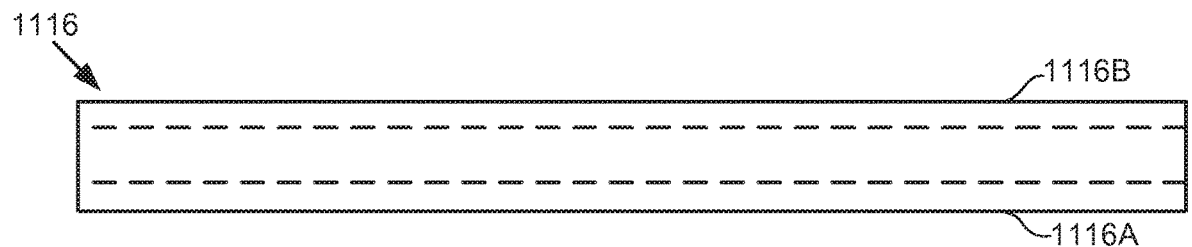

The method may then be completed with formation of a gate layer, such as the gate layer 1114 of FIG. 11A, and, in certain embodiments, the formation of a gate cap layer, such as gate cap layer 1125 depicted in FIG. 11A. With the completion of the gate stack fabrication, further processing may occur as known in the art to conclude fabrication of a SONOS-type memory device.

In another aspect the present disclosure is also directed to multigate or multigate-surface memory devices including multi-layer charge trapping layer overlying two or more sides of a channel region formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel region, and a number of second layers are deposited thereover to form a second gate. A non-planar multigate device generally includes a horizontal or vertical channel region formed on or above a surface of a substrate and surrounded on three or more sides by a gate.

Figure 13A:
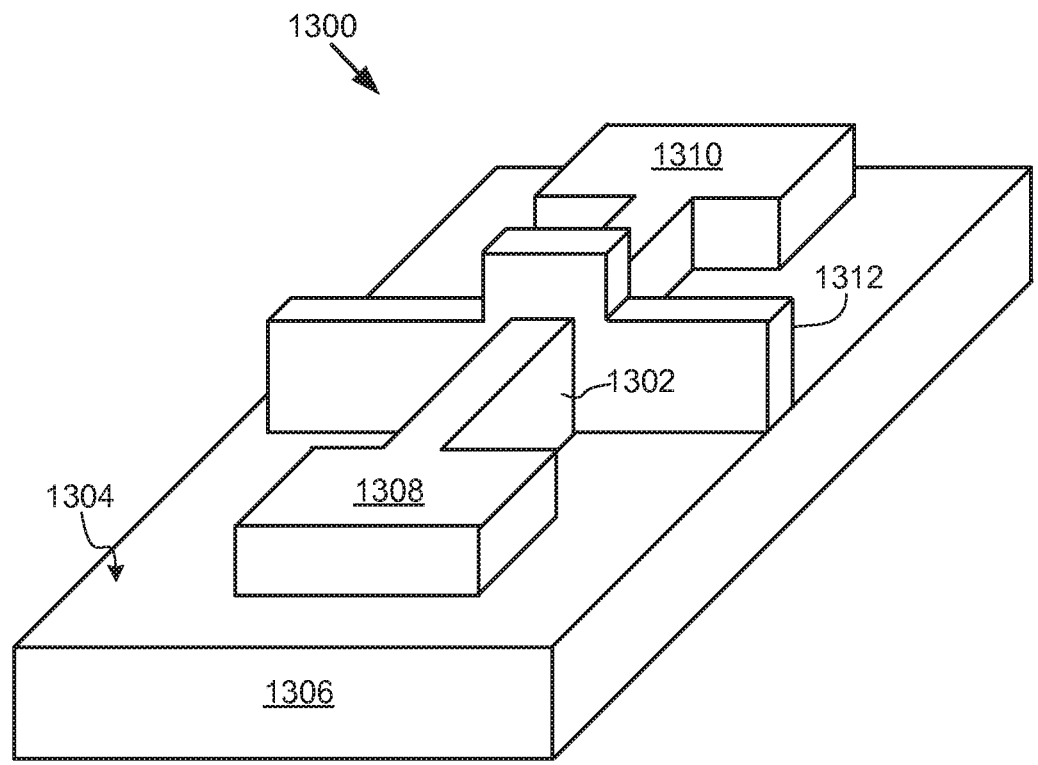
FIG. 13A illustrates a non-planar multigate device including a nitridized oxide tunneling layer, a split multi-layer charge trapping layer and a densified blocking layer according to an embodiment of the present invention.
Figure 13B:
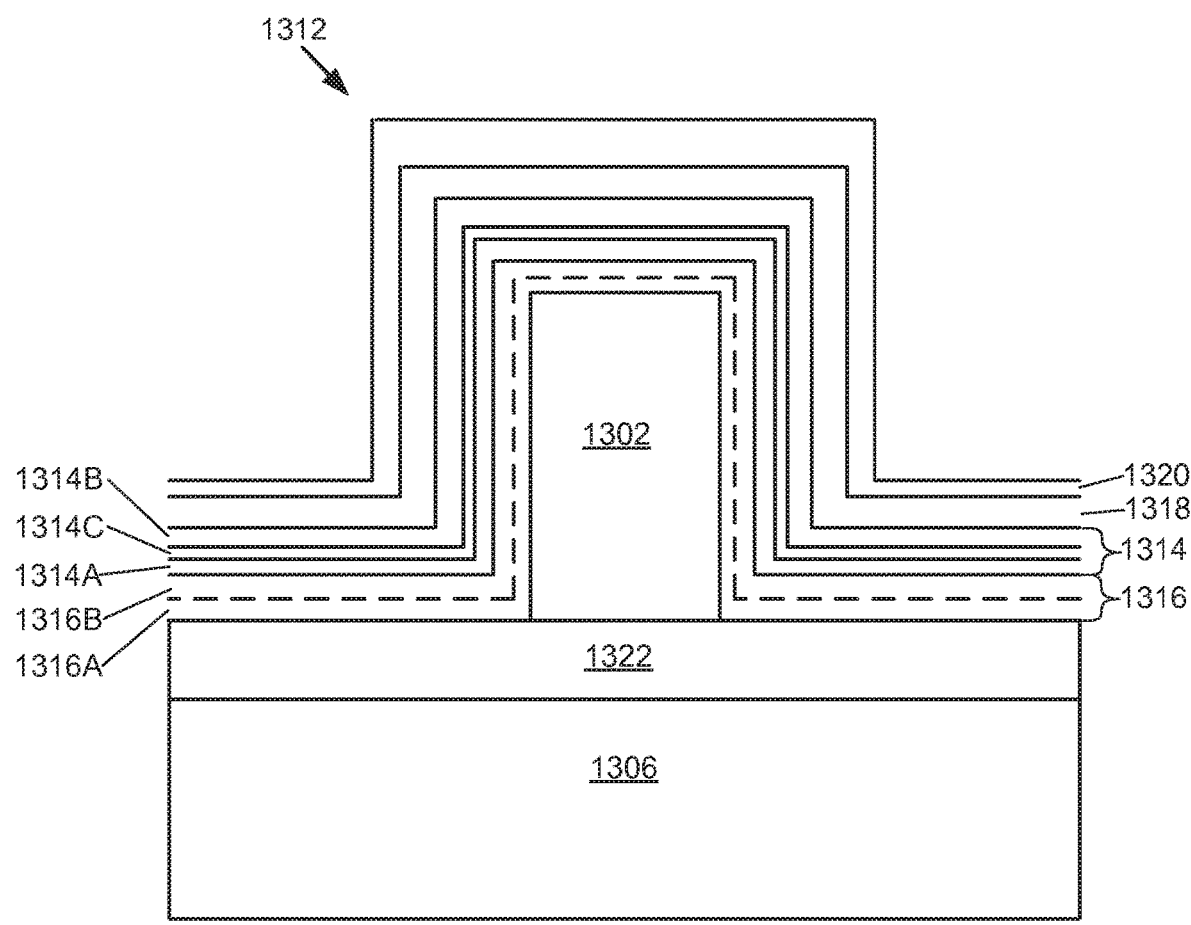
FIG. 13B illustrates a cross-sectional view of the non-planar multigate device of FIG. 13A.

FIGS. 13A and 13B illustrates one embodiment of a non-planar multigate memory device including a multi-layer charge trapping layer. Referring to FIG. 13A, the memory device 1300, commonly referred to as a finFET, includes a channel region 1302 formed from a thin film or layer of silicon containing material overlying a surface 1304 on a substrate 1306 connecting a source region 1308 and a drain region 1310 of the memory device. The channel region 1302 is enclosed on three sides by a fin which forms a gate 1312 of the device. As with the embodiments described above, the channel region 1302 can comprise polysilicon or recrystallized polysilicon to form a monocrystalline channel region. Optionally, where the channel region 1302 includes a monocrystalline silicon, the channel region can be formed to have <100> surface crystalline orientation relative to a long axis of the channel region.

The thickness of the gate 1312 (measured in the direction from source region to drain region) determines the effective channel length of the memory device.

In accordance with the present disclosure, the non-planar multigate memory device 1300 of FIG. 13A can include a multi-layer charge trapping layer, a nitridized oxide tunneling layer, and a densified blocking layer. FIG. 13B is a cross-sectional view of a portion of the non-planar memory device of FIG. 13A including a portion of the substrate 1306, channel region 1302 and the gate 1312 illustrating a multi-layer charge trapping layer 1314 a nitridized oxide tunneling layer 1316, and a densified blocking layer 1318. The gate 1312 further includes a metal gate layer 1320 overlying the blocking layer to form a control gate of the memory device 1300. In some embodiments a doped polysilicon may be deposited instead of metal to provide a polysilicon gate layer. The channel region 1302 and gate 1312 can be formed directly on substrate 1306 or on an insulating or dielectric layer 1322, such as a buried oxide layer, formed on or over the substrate.

Referring to FIG. 13B, the tunneling layer 1316 in certain embodiments, such as that shown, is a nitridized oxide tunneling layer 1316 and includes a first region 1316A proximate to the channel region 1302 having a nitrogen concentration less than about $5\times10^{21}$ nitrogen atoms/$cm^3$, and a second region 1316B proximate to the multi-layer charge trapping layer 1314 having a nitrogen concentration at least $5\times10^{21}$ nitrogen atoms/$cm^3$. In one embodiment, similar to that disclosed in FIG. 11B, the first and second regions of the nitridized oxide tunneling layer 1316 each comprise no more than approximately 25% of the tunneling layer thickness.

The multi-layer charge trapping layer 1314 includes at least one oxygen-rich first layer 1314A including nitride closer to the tunneling layer 1316, and an oxygen-lean second layer 1314B overlying the oxygen-rich first layer. Generally, the oxygen-lean second layer 1314B includes a silicon-rich, oxygen-lean nitride layer and includes a majority of a charge traps distributed in the multi-layer charge-trapping layer 1314, while the oxygen-rich first layer 1314A includes an oxygen-rich nitride or silicon oxynitride, and is oxygen-rich relative to the oxygen-lean second layer to reduce the number of charge traps therein. By oxygen-rich it is meant wherein a concentration of oxygen in the oxygen-rich first layer 1314A is from about 15 to about 40%, whereas a concentration of oxygen in the oxygen-lean second layer 1314B is less than about 5%.

In some embodiments, such as that shown in FIG. 13B, the multi-layer charge trapping layer 1314 further includes at least one thin, intermediate or anti-tunneling layer 1314C including a dielectric, such as an oxide, separating the oxygen-lean second layer 1314B from the oxygen-rich first layer 1314A. As noted above, the anti-tunneling layer 1314C substantially reduces the probability of electron charge that accumulates at the boundaries of the oxygen-lean second layer 1314B during programming from tunneling into the oxygen-rich first layer 1314A.

As with the embodiments described above, either or both of the oxygen-rich first layer 1314A and the oxygen-lean second layer 1314B can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The oxygen-lean second layer of the multi-layer charge storing structure is then formed on the middle oxide layer. The oxygen-lean second layer 1314B has a stoichiometric composition of oxygen, nitrogen and/or silicon different from that of the bottom oxygen-rich first layer 1314A, and may also be formed or deposited by a CVD process using a process gas including $N_2O/NH_3$ and $DCS/NH_3$ gas mixtures in ratios and at flow rates tailored to provide a silicon-rich, oxygen-lean top nitride layer.

In those embodiments including an intermediate or anti-tunneling layer 1314C including oxide, the anti-tunneling layer can be formed by oxidation of the oxygen-rich first layer 1314A, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

A suitable thickness for the oxygen-rich first layer 1314A may be from about 30 Å to about 130 Å (with some variance permitted, for example ±10 Å), of which about 5-20 Å may be consumed by radical oxidation to form the anti-tunneling layer 1314C. A suitable thickness for the oxygen-lean second layer 1314B may be at least 30 Å. In certain embodiments, the oxygen-lean second layer 1314B may be formed up to 130 Å thick, of which 30-70 Å may be consumed by radical oxidation to form the blocking layer 1318. A ratio of thicknesses between the oxygen-rich first layer 1314A and the oxygen-lean second layer 1314B is approximately 1:1 in some embodiments, although other ratios are also possible.

The blocking layer 1318 comprises a high temperature oxide (HTO) which is relatively denser than as-deposited A densified HTO has a lower fraction of terminal hydrogen or hydroxyl bonds. For example, removal of the hydrogen or water from an HTO has the effect of increasing the film density and improving the quality of the HTO. The higher quality oxide enables the layer to be scaled in thickness. In one embodiment, the hydrogen concentration is greater than $2.5 \times 10^{20}$ atoms/cm3 as deposited and is reduced to below $8.0 \times 10^{19}$ atoms/cm3 in the densified film. In an exemplary embodiment, the thickness of the blocking layer 1318 comprising a densified HTO is between 2.5 nm and 10.0 nm as-deposited and anywhere between 10% and 30% thinner upon densification.

In an alternate embodiment, the blocking layer 1318 is further modified to incorporate nitrogen. In one such embodiment, the nitrogen is incorporated in the form of an ONO stack across the thickness of the blocking layer 1318. Such a sandwich structure in place of the conventional pure oxygen blocking layer advantageously reduces the EOT of the entire stack between the channel region 1302 and control gate 1320 as well as enable tuning of band offsets to reduce back injection of carriers. The ONO stack blocking layer 1318 can then be incorporated with the nitridized oxide tunneling layer 1316 and split multi-layer charge trapping layer 1314 comprising an oxygen-rich first layer 1314A, an oxygen-lean second layer 1314B and an anti-tunneling layer 1314C.

Figure 14A:
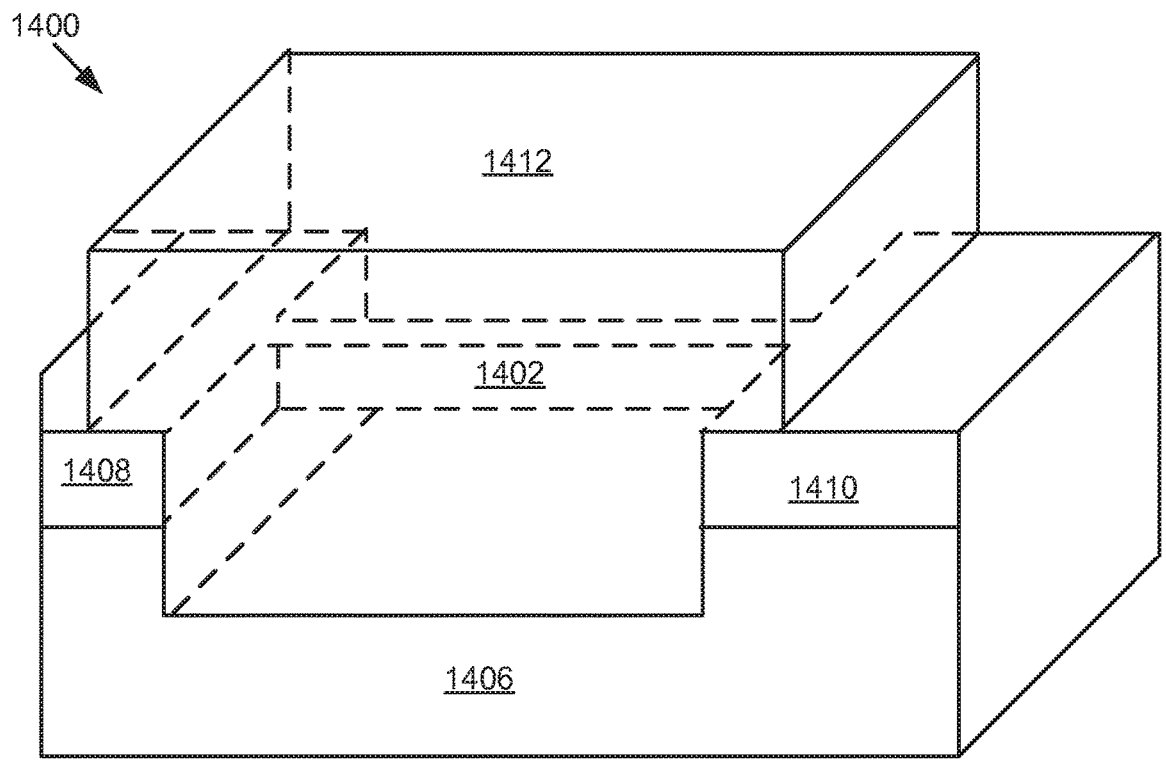
FIGS. 14A and 14B illustrate a non-planar multigate device including a nitridized oxide tunneling layer, a split multi-layer charge trapping layer, a densified blocking layer, and a horizontal nanowire channel according to an embodiment of the present invention.
Figure 14B:
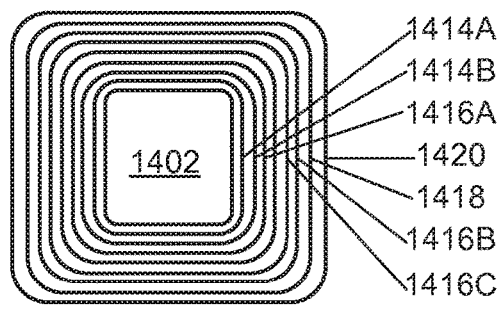

In another embodiment, shown in FIGS. 14A and 14B, the memory device can include a nanowire channel region formed from a thin film of semiconducting material overlying a surface on a substrate connecting a source region and a drain region of the memory device. By nanowire channel region it is meant a conducting channel region formed in a thin strip of crystalline silicon material, having a maximum cross-sectional dimension of about 10 nanometers (nm) or less, and more preferably less than about 6 nm. Optionally, the channel region can be formed to have <100> surface crystalline orientation relative to a long axis of the channel region.

Referring to FIG. 14A, the memory device 1400 includes a horizontal nanowire channel region 1402 formed from a thin film or layer of semiconducting material on or overlying a surface on a substrate 1406, and connecting a source region 1408 and a drain region 1410 of the memory device. In the embodiment shown, the device has a gate-all-around (GAA) structure in which the nanowire channel region 1402 is enclosed on all sides by a gate 1412 of the device. The thickness of the gate 1412 (measured in the direction from source region to drain region) determines the effective channel length of the device. As with the embodiments described above, the nanowire channel region 1402 can comprise polysilicon or recrystallized polysilicon to form a monocrystalline channel region. Optionally, where the channel region 1402 includes a monocrystalline silicon, the channel region can be formed to have <100> surface crystalline orientation relative to a long axis of the channel region.

In accordance with the present disclosure, the non-planar multigate memory device 1400 of FIG. 14A can include a multi-layer charge trapping layer, a nitridized oxide tunneling layer, and a densified blocking layer. FIG. 14B is a cross-sectional view of a portion of the non-planar memory device of FIG. 14A including a portion of the substrate 1406, nanowire channel region 1402 and the gate 1412. Referring to FIG. 14B, the gate 1412 includes a nitridized oxide tunneling layer 1414, a multi-layer charge trapping layer 1416, and a densified blocking layer 1418. The gate 1412 further includes a gate layer 1420 overlying the blocking layer to form a control gate of the memory device 1400. The gate layer 1420 can comprise a metal or a doped polysilicon.

The tunneling layer 1414 in certain embodiments, such as that shown, is a nitridized oxide tunneling layer 1414 including a first region 1414A proximate to the channel region 1402 having a nitrogen concentration less than about $5 \times 10^{21}$ nitrogen atoms/cm$^3$, and a second region 1414B proximate to the multi-layer charge trapping layer 1416 having a nitrogen concentration at least $5 \times 10^{21}$ nitrogen atoms/cm$^3$. In one embodiment, similar to that disclosed in FIG. 11B, the first and second regions of the nitridized oxide tunneling layer 1414 each comprise no more than approximately 25% of the tunneling layer thickness.

The multi-layer charge trapping layer 1416 includes at least an inner, oxygen-rich first layer 1416A including nitride closer to the tunneling layer 1414, and an outer, oxygen-lean second layer 1416B overlying the oxygen-rich first layer. Generally, the oxygen-lean second layer 1416B includes a silicon-rich, oxygen-lean nitride layer and includes a majority of a charge traps distributed in the multi-layer charge-trapping layer 1416, while the oxygen-rich first layer 1416A includes an oxygen-rich nitride or silicon oxynitride, and is oxygen-rich relative to the oxygen-lean second layer to reduce the number of charge traps therein. By oxygen-rich it is meant wherein a concentration of oxygen in the oxygen-rich first layer 1416A is from about 15 to about 40%, whereas a concentration of oxygen in the oxygen-lean second layer 1416B is less than about 5%.

In some embodiments, such as that shown in FIG. 14B, the multi-layer charge trapping layer 1416 further includes at least one thin, intermediate or anti-tunneling layer 1416C including a dielectric, such as an oxide, separating the oxygen-lean second layer 1416B from the oxygen-rich first layer 1416A. As noted above, the anti-tunneling layer 1416C substantially reduces the probability of electron charge that accumulates at the boundaries of the oxygen-lean second layer 1416B during programming from tunneling into the oxygen-rich first layer 1416A.

As with the embodiments described above, either or both of the oxygen-rich first layer 1416A and the oxygen-lean second layer 1416B can include silicon nitride or silicon oxynitride, and can be formed, for example, by a CVD process including N$_2$O/NH$_3$ and DCS/NH$_3$ gas mixtures in ratios and at flow rates tailored to provide a silicon-rich and oxygen-rich oxynitride layer. The oxygen-lean second layer of the multi-layer charge storing structure is then formed on the middle oxide layer. The oxygen-lean second layer 1416B has a stoichiometric composition of oxygen, nitrogen and/or silicon different from that of the bottom oxygen-rich first layer 1416A, and may also be formed or deposited by a CVD process using a process gas including DCS/NH$_3$ and N$_2$O/NH$_3$ gas mixtures in ratios and at flow rates tailored to provide a silicon-rich, oxygen-lean top nitride layer.

In those embodiments including an intermediate or anti-tunneling layer 1416C including oxide, the anti-tunneling layer can be formed by oxidation of the oxygen-rich first layer 1416A, to a chosen depth using radical oxidation. Radical oxidation may be performed, for example, at a temperature of 1000-1100° C. using a single wafer tool, or 800-900° C. using a batch reactor tool. A mixture of H$_2$ and O$_2$ gasses may be employed at a pressure of 300-500 Tor for a batch process, or 10-15 Tor using a single wafer tool, for a time of 1-2 minutes using a single wafer tool, or 30 min-1 hour using a batch process.

A suitable thickness for the oxygen-rich first layer 1416A may be from about 30 Å to about 130 Å (with some variance permitted, for example ±10 Å), of which about 5-20 Å may be consumed by radical oxidation to form the anti-tunneling layer 1416C. A suitable thickness for the oxygen-lean second layer 1416B may be at least 30 Å. In certain embodiments, the oxygen-lean second layer 1416B may be formed up to 130 Å thick, of which 30-70 Å may be consumed by radical oxidation to form the blocking layer 1418. A ratio of thicknesses between the oxygen-rich first layer 1416A and the oxygen-lean second layer 1416B is approximately 1:1 in some embodiments, although other ratios are also possible.

The blocking layer 1418 comprises a high temperature oxide (HTO) which is relatively denser than as-deposited. A densified HTO has a lower fraction of terminal hydrogen or hydroxyl bonds. For example, removal of the hydrogen or water from an HTO has the effect of increasing the film density and improving the quality of the HTO. The higher quality oxide enables the layer to be scaled in thickness. In one embodiment, the hydrogen concentration is greater than 2.5×1020 atoms/cm3 as deposited and is reduced to below 8.0×1019 atoms/cm3 in the densified film. In an exemplary embodiment, the thickness of the blocking layer 1418 comprising a densified HTO is between 2.5 nm and 10.0 nm as-deposited and anywhere between 10% and 30% thinner upon densification.

In an alternate embodiment, the blocking layer 1418 is further modified to incorporate nitrogen. In one such embodiment, the nitrogen is incorporated in the form of an ONO stack across the thickness of the blocking layer 1418. Such a sandwich structure in place of the conventional pure oxygen blocking layer advantageously reduces the EOT of the entire stack between the channel region 1402 and gate layer 1420 as well as enable tuning of band offsets to reduce back injection of carriers. The ONO stack blocking layer 1418 can then be incorporated with the nitridized oxide tunneling layer 1414 and split multi-layer charge trapping layer 1416 comprising an oxygen-rich first layer 1416A, an oxygen-lean second layer 1416B and an anti-tunneling layer 1416C.

Figure 14C:
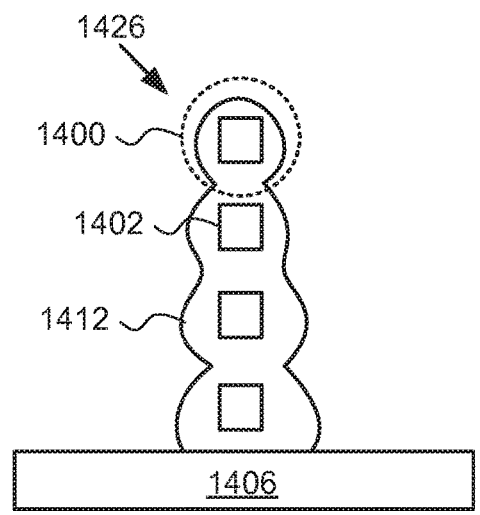
FIG. 14C illustrates a cross-sectional view of a vertical string of non-planar multigate devices of FIG. 14A.

FIG. 14C illustrates a cross-sectional view of a vertical string of non-planar multigate devices 1400 of FIG. 14A arranged in a Bit-Cost Scalable or BiCS architecture 1426. The architecture 1426 consists of a vertical string or stack of non-planar multigate devices 1400, where each device or cell includes a channel region 1402 overlying the substrate 1406, and connecting a source region and a drain region (not shown in this figure) of the memory device, and having a gate-all-around (GAA) structure in which the nanowire channel region 1402 is enclosed on all sides by a gate 1412. The BiCS architecture reduces number of critical lithography steps compared to a simple stacking of layers, leading to a reduced cost per memory bit.

In another embodiment, the memory device is or includes a non-planar device comprising a vertical nanowire channel region formed in or from a semiconducting material projecting above or from a number of conducting, semiconducting layers on a substrate. In one version of this embodiment, shown in cut-away in FIG. 15A, the memory device 1500 comprises a vertical nanowire channel region 1502 formed in a cylinder of semiconducting material connecting a source region 1504 and drain region 1506 of the device. The channel region 1502 is surrounded by a tunneling layer 1508, a multi-layer charge trapping layer 1510, a blocking layer 1512 and a gate layer 1514 overlying the blocking layer to form a control gate of the memory device 1500. The channel region 1502 can include an annular region in an outer layer of a substantially solid cylinder of semiconducting material, or can include an annular layer formed over a cylinder of dielectric filler material. As with the horizontal nanowires described above, the channel region 1502 can comprise polysilicon or recrystallized polysilicon to form a monocrystalline channel region. Optionally, where the channel region 1502 includes a monocrystalline silicon, the channel region can be formed to have <100> surface crystalline orientation relative to a long axis of the channel region.

Figure 15A:
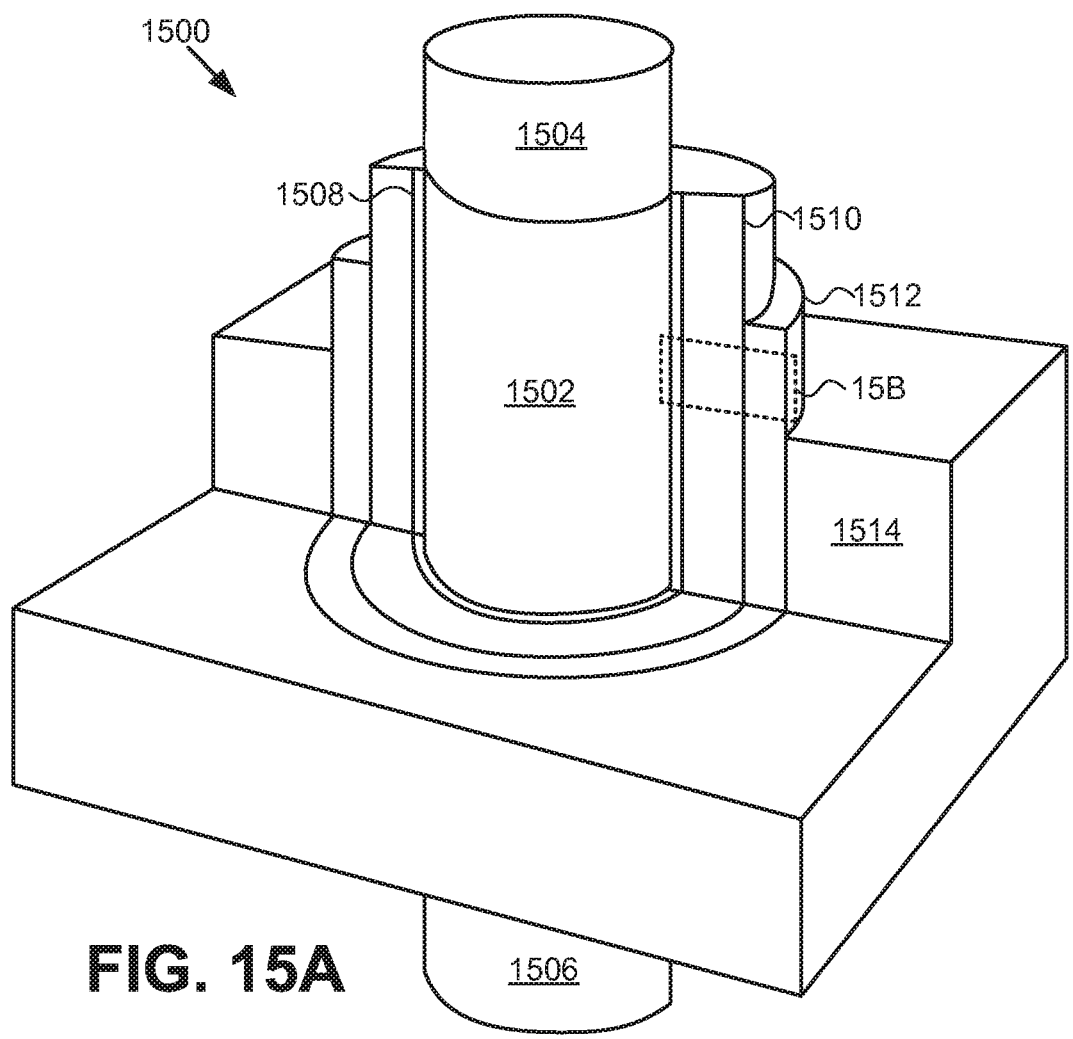
FIGS. 15A and 15B illustrate a non-planar multigate device including a nitridized oxide tunneling layer, a split multi-layer charge trapping layer, a densified blocking layer, and a vertical nanowire channel.
Figure 15B:
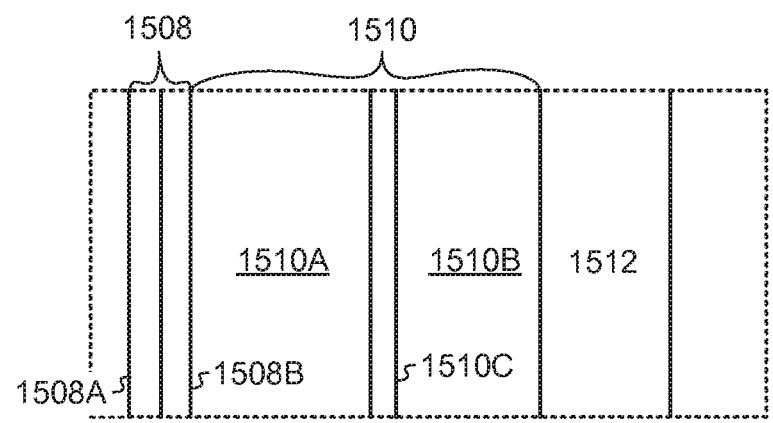

In some embodiments, such as that shown in FIG. 15B, the tunneling layer 1508, is a nitridized oxide tunneling layer including a first region 1508A proximate to the channel region 1502 having a nitrogen concentration less than about $5\times10^{21}$ nitrogen atoms/cm$^3$, and a second region 1508B proximate to the multi-layer charge trapping layer 1510 having a nitrogen concentration at least $5\times10^{21}$ nitrogen atoms/cm$^3$. In one embodiment, similar to that disclosed in FIG. 11B, the first and second regions of the nitridized oxide tunneling layer 1508 each comprise no more than approximately 25% of the tunneling layer thickness.

The multi-layer charge trapping layer 1510 is a split the multi-layer charge trapping layer further including at least an inner, oxygen-rich first layer 1510A including nitride closer to the tunneling layer 1508, and an outer, oxygen-lean second layer 1510B overlying the oxygen-rich first layer. Generally, the oxygen-lean second layer 1510B includes a silicon-rich, oxygen-lean nitride layer and includes a majority of a charge traps distributed in the multi-layer charge-trapping layer 1510, while the oxygen-rich first layer 1510A includes an oxygen-rich nitride or silicon oxynitride, and is oxygen-rich relative to the oxygen-lean second layer to reduce the number of charge traps therein. By oxygen-rich it is meant wherein a concentration of oxygen in the oxygen-rich first layer 1510A is from about 15 to about 40%, whereas a concentration of oxygen in the oxygen-lean second layer 1510B is less than about 5%.

In some embodiments, such as that shown in FIG. 15B, the split multi-layer charge trapping layer 1510 further includes at least one thin, intermediate or anti-tunneling layer 1510C including a dielectric, such as an oxide, separating the oxygen-lean second layer 1510B from the oxygen-rich first layer 1510A. As noted above, the anti-tunneling layer 1510C substantially reduces the probability of electron charge that accumulates at the boundaries of the oxygen-lean second layer 1510B during programming from tunneling into the oxygen-rich first layer 1510A.

As with the embodiments described above, either or both of the oxygen-rich first layer 1510A and the oxygen-lean second layer 1510B can include silicon nitride or silicon oxynitride, and can be formed, for example, by a CVD process including N$_2$O/NH$_3$ and DCS/NH$_3$ gas mixtures in ratios and at flow rates tailored to provide a silicon-rich and oxygen-rich oxynitride layer. The oxygen-lean second layer of the multi-layer charge storing structure is then formed on the middle oxide layer. The oxygen-lean second layer 1510B has a stoichiometric composition of oxygen, nitrogen and/or silicon different from that of the oxygen-rich first layer 1510A, and may also be formed or deposited by a CVD process using a process gas including DCS/NH$_3$ and N$_2$O/NH$_3$ gas mixtures in ratios and at flow rates tailored to provide a silicon-rich, oxygen-lean top nitride layer.

In those embodiments including an intermediate or anti-tunneling layer 1510C including oxide, the anti-tunneling layer can be formed by oxidation of the oxygen-rich first layer 1510A, to a chosen depth using radical oxidation. Radical oxidation may be performed, for example, at a temperature of 1000-1100° C. using a single wafer tool, or 800-900° C. using a batch reactor tool. A mixture of H$_2$ and O$_2$ gasses may be employed at a pressure of 300-500 Tor for a batch process, or 10-15 Tor using a single vapor tool, for a time of 1-2 minutes using a single wafer tool, or 30 min-1 hour using a batch process.

A suitable thickness for the oxygen-rich first layer 1510A may be from about 30 Å to about 130 Å (with some variance permitted, for example ±10 Å), of which about 5-20 Å may be consumed by radical oxidation to form the anti-tunneling layer 1510C. A suitable thickness for the oxygen-lean second layer 1510B may be at least 30 Å. In certain embodiments, the oxygen-lean second layer 1510B may be formed up to 130 Å thick, of which 30-70 Å may be consumed by radical oxidation to form the blocking layer 1512. A ratio of thicknesses between the oxygen-rich first layer 1510A and the oxygen-lean second layer 1510B is approximately 1:1 in some embodiments, although other ratios are also possible.

The blocking layer 1512 comprises a high temperature oxide (HTO) which is relatively denser than as-deposited. A densified HTO has a lower fraction of terminal hydrogen or hydroxyl bonds. For example, removal of the hydrogen or water from an HTO has the effect of increasing the film density and improving the quality of the HTO. The higher quality oxide enables the layer to be scaled in thickness. In one embodiment, the hydrogen concentration is greater than 2.5×1020 atoms/cm3 as deposited and is reduced to below 8.0×1019 atoms/cm3 in the densified film. In an exemplary embodiment, the thickness of the blocking layer 1512 comprising a densified HTO is between 2.5 nm and 10.0 nm as-deposited and anywhere between 10% and 30% thinner upon densification.

In an alternate embodiment, the blocking layer 1512 is further modified to incorporate nitrogen. In one such embodiment, the nitrogen is incorporated in the form of an ONO stack across the thickness of the blocking layer 1512. Such a sandwich structure in place of the conventional pure oxygen blocking layer advantageously reduces the EOT of the entire stack between the channel region 1502 and gate layer 1514 as well as enable tuning of band offsets to reduce back injection of carriers. The ONO stack blocking layer 1512 can then be incorporated with the nitridized oxide tunneling layer 1508 and split multi-layer charge trapping layer 1510 comprising an oxygen-rich first layer 1510A, an oxygen-lean second layer 1510B and an anti-tunneling layer 1510C.

The memory device 1500 of FIG. 15A can be made using either a gate first or a gate last scheme. FIGS. 16A-F illustrate a gate first scheme for fabricating the non-planar multigate device of FIG. 15A. FIGS. 17A-F illustrate a gate last scheme for fabricating the non-planar multigate device of FIG. 15A.

Figure 16A:
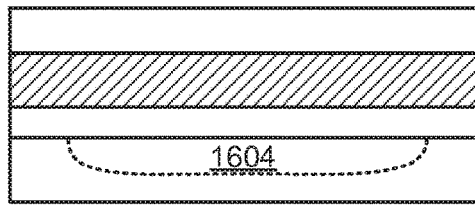
FIG. 16A through 16F illustrate a gate first scheme for fabricating the non-planar multigate device of FIG. 15A.

Referring to FIG. 16A, in a gate first scheme a first or lower dielectric layer 1602, is formed over a first, doped diffusion region 1604, such as a source region or a drain region, in a substrate 1606. A gate layer 1608 is deposited over the first dielectric layer 1602 to form a control gate of the device, and a second or upper dielectric layer 1610 formed thereover. As with embodiments described above, the first and second dielectric layers 1602, 1610, can be deposited by CVD, radical oxidation or be formed by oxidation of a portion of the underlying layer or substrate. The gate layer 1608 can comprise a metal deposited or a doped polysilicon deposited by CVD. Generally the thickness of the gate layer 1608 is from about 40-110 Å, and the first and second dielectric layers 1602, 1610, from about 20-80 Å.

Figure 16B:
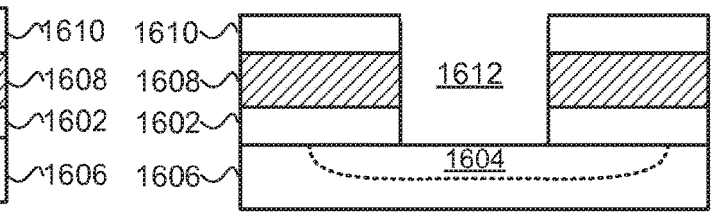
Figure 16C:
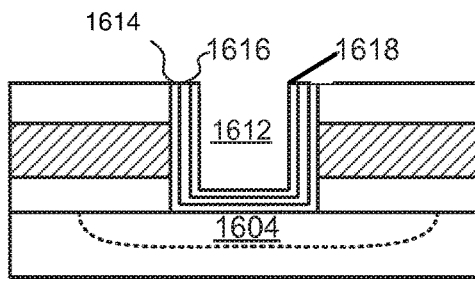

Referring to FIG. 16B, a first opening 1612 is etched through the second dielectric layer 1610, the gate layer 1608, and the first dielectric layer 1602 to the diffusion region 1604 in the substrate 1606. Next, layers of a blocking layer 1614, multi-layer charge trapping layer 1616, and tunneling layer 1618 are sequentially deposited in the opening and the surface of the upper dielectric layer 1610 planarize to yield the intermediate structure shown in FIG. 16C.

As in the embodiments described above the blocking layer 1614 can be a densified blocking layer, comprising a densified HTO which is relatively denser than as-deposited, and has a lower fraction of terminal hydrogen or hydroxyl bonds.

Although not shown, it will be understood that as in the embodiments described above the multi-layer charge trapping layer 1616 can include a split multi-layer charge trapping layer comprising an outer, oxygen-lean second layer closer to or deposited on the densified blocking layer 1614, and an inner, oxygen-rich first layer deposited or formed on the oxygen-lean second layer. Generally, the oxygen-lean second layer comprises a silicon-rich, oxygen-lean nitride layer and comprises a majority of a charge traps distributed in multiple charge-trapping layers, while the oxygen-rich first layer comprises an oxygen-rich nitride or silicon oxynitride, and is oxygen-rich relative to the top charge-trapping layer to reduce the number of charge traps therein. In some embodiments, the multi-layer charge trapping layer 1616 is a split multi-layer charge trapping layer further including at least one thin, intermediate or anti-tunneling layer comprising a dielectric, such as an oxide, separating the outer, oxygen-lean second layer closer from the inner, oxygen-rich first layer.

It will further be understood that the tunneling layer 1618 is a nitridized oxide tunneling layer, and can include a first region having a nitrogen concentration less than about $5 \times 10^{21}$ nitrogen atoms/cm$^3$ overlying a second region proximate to the multi-layer charge trapping layer 1616 having a nitrogen concentration at least $5 \times 10^{21}$ nitrogen atoms/cm$^3$.

Figure 16D:
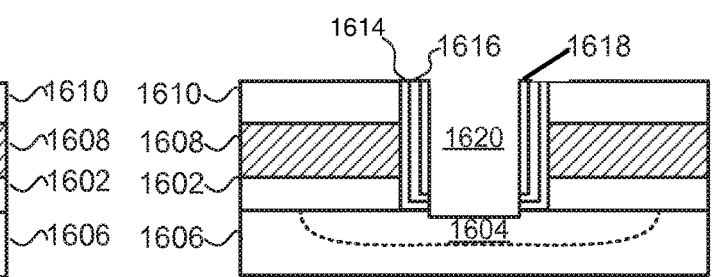
Figure 16E:
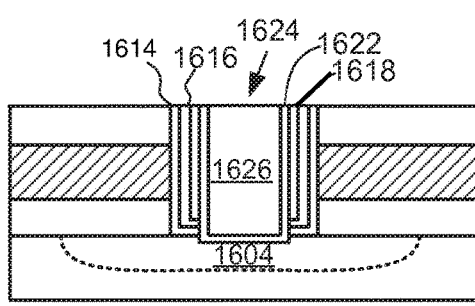

Next, referring to FIG. 16D, a second or channel opening 1620 is anisotropically etched through tunneling layer 1618, multi-layer charge trapping layer 1616, and blocking layer 1614 to expose a portion of the diffusion region 1604 in the substrate 1606. Referring to FIG. 16E, a semiconducting material 1622 is deposited in the channel opening to form a vertical channel region 1624 therein. The vertical channel region 1624 can include an annular region in an outer layer of a substantially solid cylinder of semiconducting material, or, as shown in FIG. 16E, can include a separate, layer of semiconducting material 1622 surrounding a cylinder of filler material 1626.

Figure 16F:
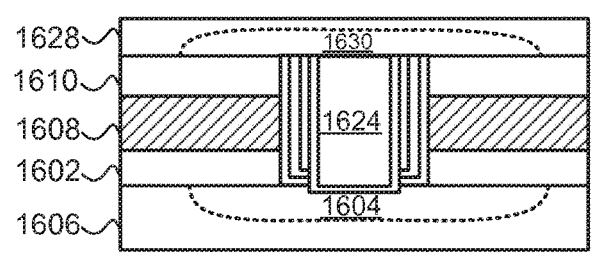

Referring to FIG. 16F, the surface of the upper dielectric layer 1610 is planarized and a layer of semiconducting material 1628 including a second, doped diffusion region 1630, such as a source region or a drain region, formed therein deposited over the upper dielectric layer to form the device shown.

Figure 17A:
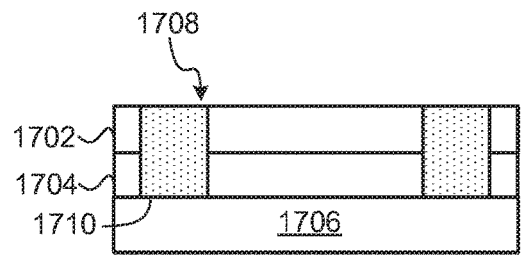
FIG. 17A through 17F illustrate a gate last scheme for fabricating the non-planar multigate device of FIG. 15A.

Referring to FIG. 17A, in a gate last scheme a dielectric layer 1702, such as an oxide, is formed over a sacrificial layer 1704 on a surface on a substrate 1706, an opening etched through the dielectric and sacrificial layers and a vertical channel region 1708 formed therein. As with embodiments described above, the vertical channel region 1708 can include an annular region in an outer layer of a substantially solid cylinder of semiconducting material 1710, such as polycrystalline or monocrystalline silicon, or can include a separate, layer of semiconducting material surrounding a cylinder of dielectric filler material (not shown). The dielectric layer 1702 can comprise any suitable dielectric material, such as a silicon oxide, capable of electrically isolating the subsequently formed gate layer of the memory device 1500 from an overlying electrically active layer or another memory device. The sacrificial layer 1704 can comprise any suitable material that can be etched or removed with high selectivity relative to the material of the dielectric layer 1702, substrate 1706 and vertical channel region 1708.

Figure 17B:
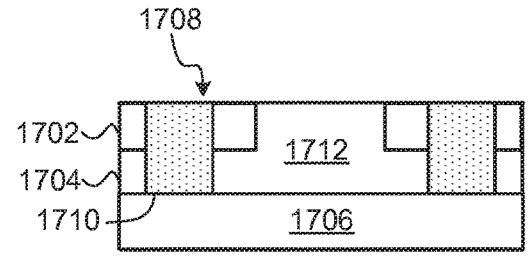

Referring to FIG. 17B, a second opening 1712 is etched through the dielectric and sacrificial layers 1702, 1704, to the substrate 1706, and the sacrificial layer 1704 at least partially etched or removed. The sacrificial layer 1704 can comprise any suitable material that can be etched or removed with high selectivity relative to the material of the dielectric layer 1702, substrate 1706 and vertical channel region 1708. In one embodiment the sacrificial layer 1704 comprises that can be removed by Buffered Oxide Etch (BOE etch).

Figure 17C:
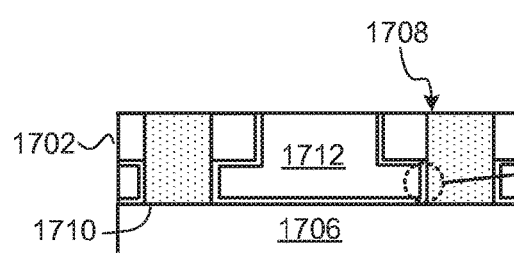
Figure 17D:
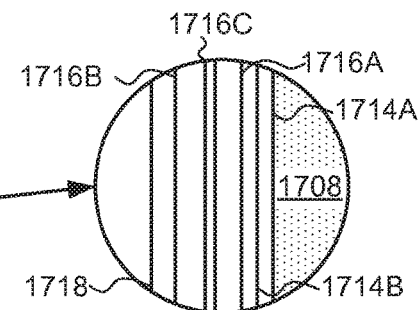

Referring to FIGS. 17C and 17D, layers of a tunneling layer 1714A-B comprising a nitridized oxide, a multi-layer charge trapping layer 1716A-C. and a blocking layer 1718 are sequentially deposited in the opening and the surface of the dielectric layer 1702 planarize to yield the intermediate structure shown in FIG. 17C. As in the embodiments described above the blocking layer 1718 can be a densified blocking layer, comprising a densified HTO which is relatively denser than as-deposited, and has a lower fraction of terminal hydrogen or hydroxyl bonds.

In some embodiments, such as that shown in FIG. 17D, the nitridized oxide tunneling layer including a first region 1714A proximate to the semiconducting material 1710 having a nitrogen concentration less than about $5 \times 10^{21}$ nitrogen atoms/cm$^3$ and a second region 1714B proximate to the multi-layer charge trapping layer 1716A-C having a nitrogen concentration at least $5 \times 10^{21}$ nitrogen atoms/cm$^3$.

The multi-layer charge trapping layer 1716A-C is a split multi-layer charge trapping layer including at least an inner oxygen-rich first layer 1716A closest to the nitridized oxide tunneling layer 1714, and an outer, oxygen-lean second layer 1716B. Optionally, the first and second charge trapping layers can be separated by an intermediate oxide or anti-tunneling layer 1716C.

Figure 17E:
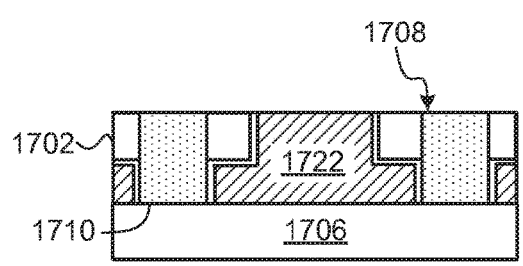
Figure 17F:
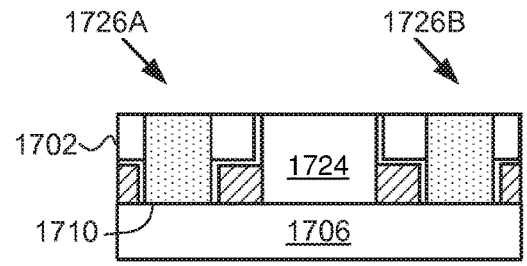

Next, a gate layer 1722 is deposited into the second opening 1712 and the surface of the upper dielectric layer 1702 planarized to yield the intermediate structure illustrated in FIG. 17E. As with embodiments described above, the gate layer 1722 can comprise a metal deposited or a doped polysilicon. Finally, an opening 1724 is etched through the gate layer 1722 to form control gate of separate memory devices 1726A and 1726B.

Thus, a method for fabricating a nonvolatile charge trap memory device has been disclosed. In accordance with an embodiment of the present invention, a substrate is subjected to a first radical oxidation process to form a first dielectric layer in a first process chamber of a cluster tool. A charge-trapping layer may then be deposited above the first dielectric layer in a second process chamber of the cluster tool. In one embodiment, the charge-trapping layer is then subjected to a second radical oxidation process to form a second dielectric layer above the charge-trapping layer by oxidizing a portion of the charge-trapping layer in the first process chamber of the cluster tool. By forming all layers of an oxide-nitride-oxide (ONO) stack in a cluster tool, interface damage may be reduced between the respective layers. Thus, in accordance with an embodiment of the present invention, an ONO stack is fabricated in a single pass in a cluster tool in order to preserve a pristine interface between the layers in the ONO stack. In a specific embodiment, the cluster tool is a single-wafer cluster tool.

What is claimed is:

1. A method of fabricating a memory device, comprising:
forming a channel region from semiconductor material;
forming a tunneling layer structure abutting the channel region, wherein forming the tunneling layer structure comprises forming an oxide film and subsequently nitridizing the oxide film;
forming a multi-layer charge trapping layer comprising a first oxynitride layer abutting the tunneling layer, a second oxynitride layer, and an anti-tunneling oxide layer separating the first oxynitride layer and the second oxynitride layer; and
forming a blocking layer abutting the multi-layer charge trapping layer.

2. The method of claim 1, wherein the channel region includes a vertical nanowire.

3. The method of claim 2, wherein the tunneling layer structure completely surrounds at least one portion of a vertical axis of the channel region.

4. The method of claim 1, wherein the first oxynitride layer is oxygen-rich and the second oxynitride layer is oxygen-lean.

5. The method of claim 4, wherein the first oxynitride layer has a concentration of oxygen in a range of 15% to 40%, and the second oxynitride layer has a concentration of oxygen in a range of less than 5%.

6. The method of claim 1, wherein the second oxynitride layer has a majority of charge traps distributed in the multi-layer charge trapping layer.

7. The method of claim 1, the multi-layer charge trapping layer further includes at least one additional oxynitride layer disposed between the first oxynitride layer and the second oxynitride layer, each of the first oxynitride layer, the second oxynitride layer and the at least one additional oxynitride layer having a stoichiometric composition of oxygen, nitrogen, and silicon that is different from one another.

8. The method of claim 1, wherein the tunneling layer structure includes a first tunneling layer disposed proximate to the channel region and a second tunneling layer disposed proximate to the multi-layer charge trapping layer, wherein a thickness of each of the first tunneling layer and the second tunneling layer is 25% of a total thickness of the tunneling layer, and wherein the first tunneling layer has a nitrogen concentration lower than that of the second tunneling layer.

9. The method of claim 8, wherein the first tunneling layer has the nitrogen concentration of less than $5 \times 10^{21}$ nitrogen atom/cm$^3$, and the second tunneling layer has the nitrogen concentration of at least $5 \times 10^{21}$ nitrogen atom/cm$^3$.

10. The method of claim 1, wherein the blocking layer includes densified oxide having a hydrogen concentration less than $8.0 \times 10^{19}$ hydrogen atoms/cm$^3$.

11. The method of claim 1, further comprising forming a gate abutting the blocking layer.

12. A method of fabricating a memory device, comprising:
forming a blocking layer abutting a control gate;
densifying the blocking layer;
depositing an outer charge trapping layer abutting the densified blocking layer;
forming an anti-tunneling oxide layer abutting the outer charge trapping layer;
depositing an inner charge trapping layer abutting the anti-tunneling oxide layer;
forming a tunneling oxide layer abutting the inner charge trapping layer;
nitridizing the tunneling oxide layer;
forming a channel region abutting the nitridized tunneling oxide layer.

13. The method of claim 12, further comprises:
reoxidizing the nitridized tunneling oxide layer; and
renitridizing the reoxidized nitridized tunneling oxide layer.

14. The method of claim 13, wherein the renitridized reoxidized nitridized tunneling oxide layer includes a first tunneling layer disposed proximate to the channel region and a second tunneling layer disposed proximate to the inner charge trapping layer, wherein a thickness of each of the first tunneling layer and the second tunneling layer is 25% of a total thickness of the renitridized reoxidized nitridized tunneling oxide layer, and wherein the first tunneling layer has a nitrogen concentration lower than that of the second tunneling layer.

15. The method of claim 12, wherein forming the channel region includes forming a vertical semiconductor nanowire.

16. The method of claim 12, further comprising:
forming at least one additional charge trapping layer disposed between the outer charge trapping layer and the inner charge trapping layer, wherein each of the outer charge trapping layer, the inner charge trapping layer, and the at least one additional charge trapping layer have a stoichiometric composition of oxygen, nitrogen, and silicon that is different from one another.

17. The method of claim 12, wherein the inner charge trapping layer is oxygen-rich and has a concentration of oxygen in a range of 15% to 40%, and
wherein the outer charge trapping layer is oxygen-lean and has a concentration of oxygen in a range of less than 5%.

18. The method of claim 12, further comprising:
forming the control gate, wherein the control gate is formed before forming the blocking layer.

19. The method of claim 12, further comprising:
forming the control gate, wherein the control gate is formed after forming the blocking layer.

20. The method of claim 12, wherein the outer charge trapping layer, the inner charge trapping layer and the anti-tunneling oxide layer formed a multi-layer charge trapping layer, and wherein the outer charge trapping layer includes a majority of charge traps distributed in the multi-layer charge trapping layer.

21. The method of claim 12, wherein forming the blocking layer includes forming a high temperature oxide (HTO) layer, and wherein densifying the blocking layer includes removing hydrogen and water from the HTO layer, wherein the densified blocking layer has a hydrogen concentration less than $8.0 \times 10^{19}$ hydrogen atoms/cm$^3$.

* * * * *